(12) United States Patent
Takehashi et al.

(10) Patent No.: US 7,491,000 B2
(45) Date of Patent: Feb. 17, 2009

(54) BASE STRUCTURE FOR LIGHT EMITTING DEVICE AND LIGHT EMITTING DEVICE USING THE SAME

(75) Inventors: Nobuyuki Takehashi, Higashiomi (JP); Mitsugu Uraya, Higashiomi (JP); Masakazu Yasui, Ayabe (JP); Kousuke Katabe, Higashiomi (JP); Yuuki Mori, Higashiomi (JP); Daisuke Sakumoto, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 264 days.

(21) Appl. No.: 11/411,942

(22) Filed: Apr. 27, 2006

(65) Prior Publication Data

US 2006/0261360 A1    Nov. 23, 2006

(30) Foreign Application Priority Data

Apr. 27, 2005  (JP)  ............................. 2005-129155
Dec. 26, 2005  (JP)  ............................. 2005-373429
Mar. 27, 2006  (JP)  ............................. 2006-086281

(51) Int. Cl.
*G02B 6/36* (2006.01)
*H01L 33/00* (2006.01)

(52) U.S. Cl. ............................. 385/92; 385/94; 257/98; 257/100

(58) Field of Classification Search ............. 385/88–94, 385/49; 257/98–100
See application file for complete search history.

(56) References Cited

U.S. PATENT DOCUMENTS

| | | | |
|---|---|---|---|
| 2004/0065894 A1* | 4/2004 | Hashimoto et al. | ........... 257/100 |
| 2004/0251469 A1* | 12/2004 | Yatsuda et al. | ............... 257/100 |
| 2005/0224821 A1* | 10/2005 | Sakano et al. | ................. 257/79 |
| 2006/0278882 A1* | 12/2006 | Leung et al. | ................... 257/98 |

* cited by examiner

*Primary Examiner*—Hemang Sanghavi
(74) *Attorney, Agent, or Firm*—Oblon, Spivak, McClelland, Maier & Neustadt, P.C.

(57) ABSTRACT

A base structure for a light emitting device includes a supporting device for supporting a light emitting element, a connection device for being electrically connected to the light emitting element, and a filler member. The supporting device includes a metallic material. The connection device surrounds the supporting device and includes a metallic material. The filler member fills a gap separating the supporting device from the connection device.

31 Claims, 20 Drawing Sheets

BASE STRUCTURE FOR LIGHT EMITTING DEVICE AND LIGHT EMITTING DEVICE USING THE SAME

CROSS-REFERENCES TO RELATED APPLICATIONS

The present application claims priority to Japanese Patent Application No. 2005-129155, filed Apr. 27, 2005, Japanese Patent Application No. 2005-373429, filed Dec. 26, 2005, and Japanese Patent Application No. 2006-86281, filed Mar. 27, 2006. The contents of those applications are incorporated herein by reference in their entirety.

BACKGROUND OF THE INVENTION

1. Field of the Invention

The present invention relates to a base structure for a light emitting device and a light emitting device using the base structure.

2. Discussion of the Background

In recent years, the trend for using light emitting devices for lighting has been increasing, and there have been demands for light emitting devices having high luminance and good heat dissipation characteristics. For example, Japanese Unexamined Patent Application Publication No. 2003-37298 discloses a surface mounting LED lamp shown in FIG. 14. The LED lamp includes a ceramic base 11 on which an LED chip 15 is mounted and a lamp house 12. The lamp house 12 is filled with a transparent resin 13. The contents of this publication are incorporated herein by reference in their entirety.

SUMMARY OF THE INVENTION

According to one aspect of the present invention, a base structure for a light emitting device includes a supporting device for supporting a light emitting element, a connection device for being electrically connected to the light emitting element, and a filler member. The supporting device includes a metallic material. The connection device surrounds the supporting device and includes a metallic material. The filler member fills a gap separating the supporting device from the connection device.

According to another aspect of the present invention, a base structure for a light emitting device includes a supporting device for supporting a light emitting element, and an insulating member. The supporting device includes a metallic material. The insulating member electrically insulates the supporting device and includes a transparent resin and a particulate material which has a refractive index higher than the transparent resin. The insulating member has a reflective surface for reflecting light emitted from the light emitting element, and the reflective surface is provided around the supporting surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
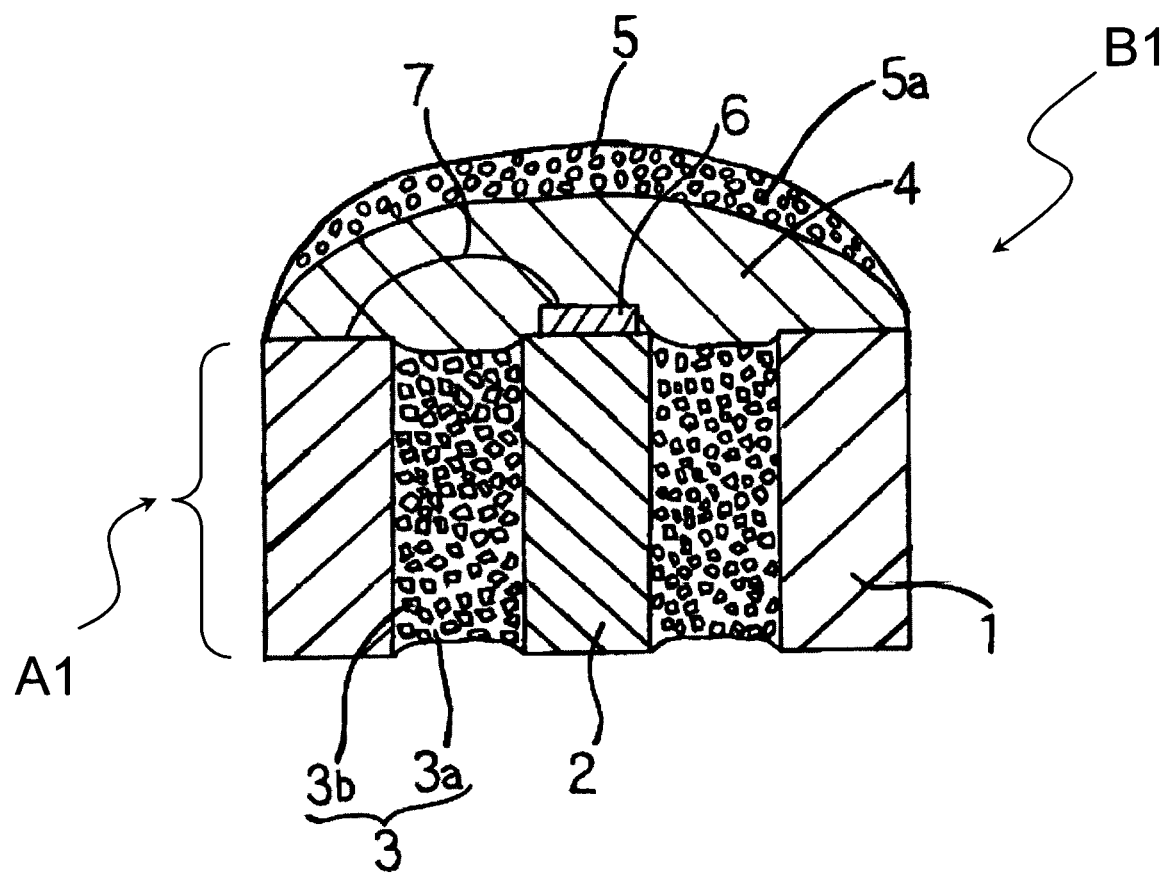
FIG. 1 is a cross-sectional view of a light emitting device according to an embodiment of the present invention.

The embodiments will now be described with reference to the accompanying drawings, wherein like reference numerals designate corresponding or identical elements throughout the various drawings.

Figure 2:
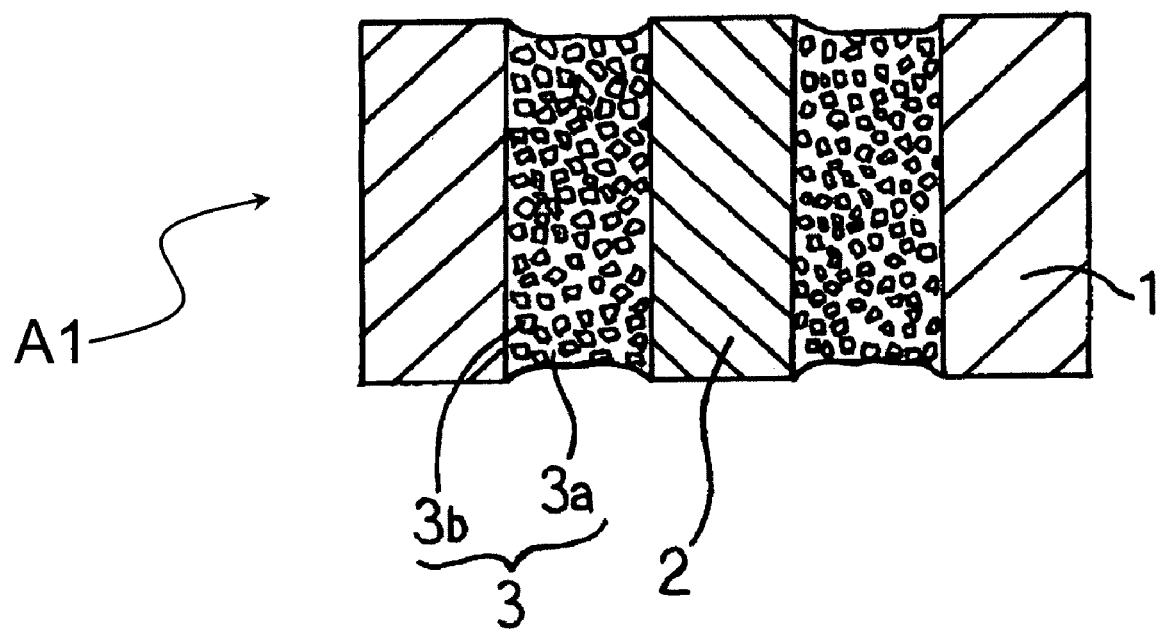
FIG. 2 is a cross-sectional view of a base structure for mounting a light emitting element, provided in the light emitting device shown in FIG. 1.

FIG. 1 is a cross-sectional view of a light emitting device (B1) according to an embodiment of the present invention, and FIG. 2 is a cross-sectional view of a base structure (A1) provided in the light emitting device (B1). The structure of the light emitting device (B1) and the base structure (A1) will be described with reference to FIGS. 1 and 2. The light emitting device (B1) includes the base structure (A1), a transparent resin layer 4, a light transmitting resin layer 5, a light emitting element 6, and a bonding wire 7. The base structure (A1) includes a connection member 1, a supporting metallic member 2, and a filler member 3.

The connection member 1 has a cylindrical shape, a polygonal prism shape, or the like, having a through hole extending between the upper and lower surfaces thereof. The supporting metallic member 2 is disposed so as to vertically extend inside the connection member 1, and the upper end thereof is a light emitting element mounting portion for supporting the light emitting element 6. The filler member 3 fills a gap separating the supporting metallic member 2 from the connection member 1 and includes a transparent resin 3a and a particulate material 3b. The particulate material 3b is mixed with the transparent resin 3a and is composed of a material having a higher refractive index than that of the transparent resin 3a. The transparent resin layer 4 is disposed so as to cover the light emitting element 6, and the light transmitting resin layer 5, which contains a phosphor 5a, is disposed so as to cover the transparent resin layer 4. The bonding wire 7 electrically connects an electrode of the light emitting element 6 and the connection member 1.

The connection member 1 is composed of an electro-conductive material, for example, a metal, such as Al, an Al alloy, Cu, a Cu alloy, magnesium (Mg), stainless steel (SUS), or Fe. The connection member 1 also functions as a conductive path for supplying an electric current to the light emitting element 6. One electrode of the light emitting element 6 and the upper surface of the connection member 1 are electrically connected by the bonding wire 7. In order to more efficiently carry out a connection step using the bonding wire 7, preferably, the upper surface of the connection member 1 is located higher than the upper surface of the supporting metallic member 2 by a height of an electrode of the light emitting element 6. Furthermore, the upper surface of the connection member 1 is preferably a reflection surface which effectively reflects light. In order to form an effective reflection surface, the upper surface of the connection member 1 may be polished or smoothened by pressing with a die. Alternatively, a high-reflectance metallic thin layer composed of Al, Ag, gold (Au), platinum (Pt), titanium (Ti), chromium (Cr), Ni, Cu, or an alloy thereof may be formed on the upper surface of the connection member 1, for example, by plating or vapor deposition. Furthermore, as necessary, by providing a screw shape (C) on the lower outer circumferential portion of the connection member 1 (refer to FIG. 6), the base structure (A1) can be screwed into a socket like a light bulb. In view of this, preferably, at least the lower outer circumferential portion of the connection member 1 has a cylindrical shape. Compared with other joining methods such as soldering, such screw joining by utilizing the screw shape (C) will more effectively prevent problems, e.g., unfastening of the light emitting device when the joint is subjected to impact, or connection failure and a decrease in yield resulting from the inhibition of solder flow due to a nonuniform atmosphere during joining. It is also possible to fabricate a replaceable light emitting device that does not require use of a tool.

The supporting metallic member 2 is disposed inside the through hole of the connection member 1, for example, so as to vertically extend in the center portion. The supporting metallic member 2 is composed of a good heat conductor, such as Cu, a Cu alloy, Mg, Al, an Al alloy, SUS, or Fe, and has a cylindrical shape, a prismatic shape, or the like. The upper and lower surfaces of the supporting metallic member 2 are exposed without being covered with the filler member 3, and the light emitting element 6 is mounted on the upper surface.

Also, the supporting metallic member 2 may preferably have an outer circumference which varies in size in the vertical direction.

The light transmitting resin layer 5 is prepared by incorporating a phosphor 5a into a transparent member, e.g., a transparent resin (or transparent polymer), such as a silicone resin, an epoxy resin, a polycarbonate resin, an acrylic resin, or a fluorocarbon resin, or a transparent glass, such as quartz glass or an optical glass containing boric acid and silica. For example, as shown in FIGS. 1, 6, 11, and 12, the material for the light transmitting resin layer 5 is applied to the surface of the transparent resin layer 4 such that the central portion is thicker than the peripheral portion, and then the transparent member is hardened to form the light transmitting resin layer 5 covering the transparent resin layer 4.

Various phosphor materials can be used as the phosphor 5a. Examples thereof include particles of $La_2O_2S$:Eu (Eu-doped $La_2O_2S$) and $LiEuW_2O_8$ for conversion into red light, ZnS: Cu, Al and $SrAl_2O_4$:Eu for conversion into green light, and $(BaMgAl)_{10}O_{12}$:Eu and $BaMgAl_{10}O_{17}$:Eu for conversion into blue light. These phosphor materials may be used alone or may be used in combination in any ratio, thereby enabling output of light with desired emission spectrum and color.

The light emitting element 6 is, for example, a semiconductor light emitting element with vertical structure, such as an LED composed of gallium nitride (Ga—N) or indium gallium nitride (In—Ga—N), and electrodes are disposed on upper and lower surfaces of the element. Because of such a structure of the light emitting element 6, by joining one electrode (on lower side) to the supporting metallic member 2, electrical connection with the supporting metallic member 2 is achieved, and an electric current can be supplied to the light emitting element 6. In addition, heat generated from the light emitting element 6 can be efficiently dissipated outside through the supporting metallic member 2.

In a typical method of joining the light emitting element 6 to the upper surface of the supporting metallic member 2, joining is performed using a brazing filler metal or a solder, such as Au—Sn, Sn—Ag, Sn—Ag—Cu, or Sn-lead (Pb). Alternatively, joining may be performed using a solder or an Ag epoxy resin (epoxy resin to which electroconductivity is imparted by incorporation of Ag particles). The other electrode of the light emitting element 6 is electrically connected to the connection member 1 having a cylindrical shape or the like by a wire bonding method. In comparison with a LED mounting base structure in which two electrodes are disposed on the front (upper) surface of a light emitting element 6 and the electrodes are connected to predetermined electrodes on the LED mounting base structure using two bonding wires, in the base structure (A1) according to this embodiment, connection is performed using one bonding wire 7, and thus light emitted from the light emitting element 6 is not blocked by the bonding wire 7 and the light emission luminance of the light emitting device can be further increased.

Furthermore, since the lower electrode (positive electrode) of the light emitting element 6 mounted on the upper surface of the supporting metallic member 2 is directly connected to the supporting metallic member 2 with a brazing filler metal or an electro-conductive resin binder, there is no need to use a bonding wire 7, thus greatly contributing to the productivity.

The method for mounting the light emitting element 6 is not limited to the methods described above. For example, a light emitting element 6 may be placed between the supporting metallic member 2 and the connection member 1 so as to extend over the filler member 3, and flip chip mounting may be performed with the electrodes being on the lower side.

After the light emitting element 6 is mounted on the upper surface of the supporting metallic member 2 by electrically connecting the lower terminal of the light emitting element 6 to the upper surface of the supporting metallic member 2 with an electro-conductive joining material or the like, the transparent resin layer 4 is disposed so as to cover the light emitting element 6. Thereby, a lighting apparatus is produced. Additionally, in order to convert light emitted from the light emitting element 6 into desired color, a light transmitting resin layer 5 which contains a phosphor 5a or the like that is capable of performing wavelength conversion of light of the light emitting element 6 may be disposed so as to cover the light emitting element 6.

In the light emitting element 6, the peak wavelength of energy emission may be any wavelength from the ultraviolet range to the infrared range. From the standpoint that white light and light with various colors can be emitted at high luminosity, a light emitting element which emits light at 300 nm to 500 nm, i.e., from the near-ultraviolet region to the blue region, is preferred. For example, a gallium nitride compound semiconductor in which a buffer layer, an N-type layer, an active layer and a P-type layer, composed of Ga—N, Al—Ga—N, In—GaN, or the like, are disposed in that order on a sapphire substrate, or a silicon carbide compound semiconductor may be used. Note that the ultraviolet region of light emitted by the light emitting element 6 corresponds to electromagnetic waves with wavelengths in the range having a lower limit of 360 to 400 nm, i.e., the short wavelength end of visible light, and an upper limit of about 1 nm (refer to Rikagakujiten, 5th ed., Iwanami Shoten). The blue region corresponds to the wavelength range having an upper limit of 360 to 400 nm, i.e., the short wavelength end of visible light, and a lower limit of about 495 nm (refer to JIS Z8701: chromaticity coordinates in XYZ calorimetric system).

In the light emitting device according to this embodiment, since the light emitting element 6 is used, it is possible to provide a light emitting device with lower power consumption and longer life than lighting apparatuses using fluorescent lamp. Moreover, since heat can be quickly dissipated by the light emitting element mounting base structure according to this embodiment, it is possible to provide a smaller light emitting device in which the increase in the temperature of the light emitting element 6 is reduced. Because of the smaller increase in the temperature of the light emitting element 6, it is possible to suppress fluctuation in the center wavelength of light emitted from the light emitting element 6. Thus, it is possible to provide a light emitting device which can emit light for a long period of time with more stable luminance and in which irregular color and deviation in illumination distribution in the irradiation surface are suppressed. Examples of such a light emitting device include devices used indoors and outdoors, such as general lighting equipment, chandelier lighting equipment, home lighting equipment, office lighting equipment, store and display lighting equipment, street lighting equipment, emergency exit luminaries and signaling equipment, stage and studio lighting equipment, advertising lamps, illumination poles, underwater illuminating lights, strobe lights, spotlights, security lights to be embedded in electric light poles and the like, emergency lighting equipment, flashlights, electric bulletin boards, backlights for dimmers, flashers, displays, etc., motion picture apparatuses, accessories, illumination-type switches, optical sensors, medical lights, and vehicular lights.

Figure 3:
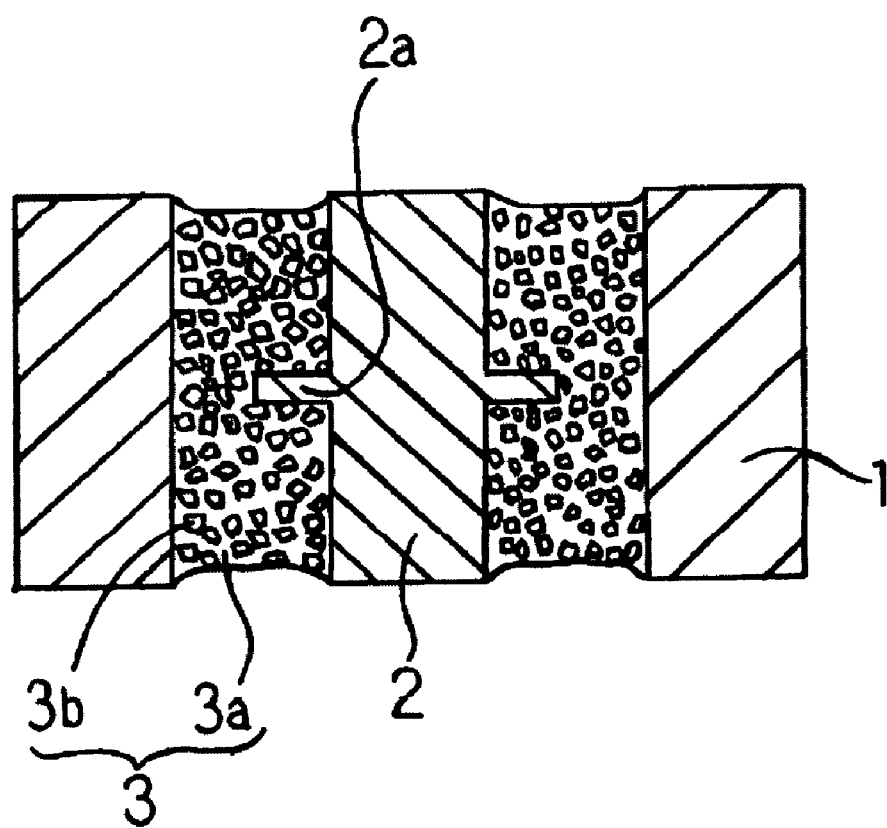
FIG. 3 is a cross-sectional view of a base structure for mounting a light emitting element, according to another embodiment of the present invention.
Figure 18A:
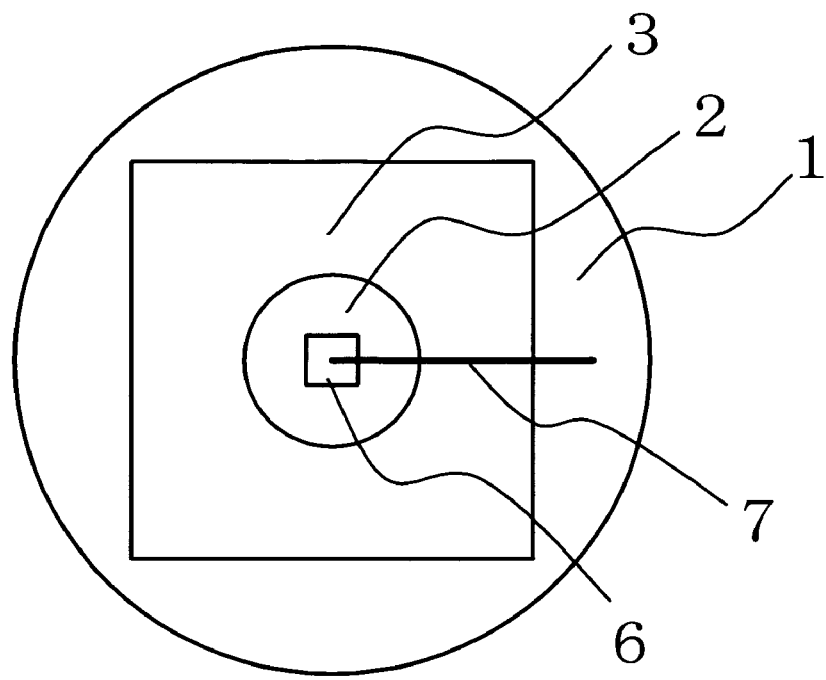
FIG. 18A and FIG. 18B are top plan views of base structures for mounting a light emitting element, according to other embodiments of the present invention.
Figure 18B:
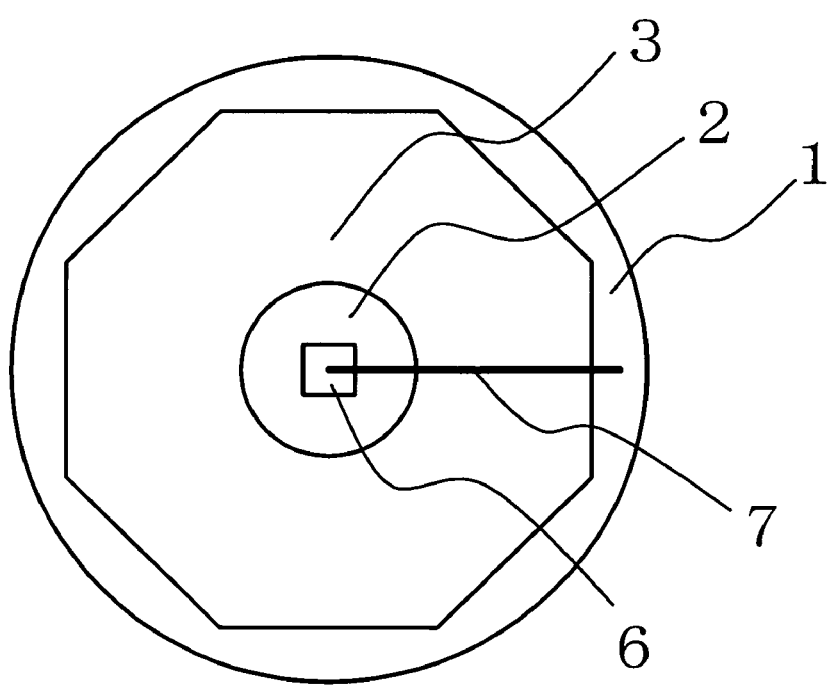
Figure 19:
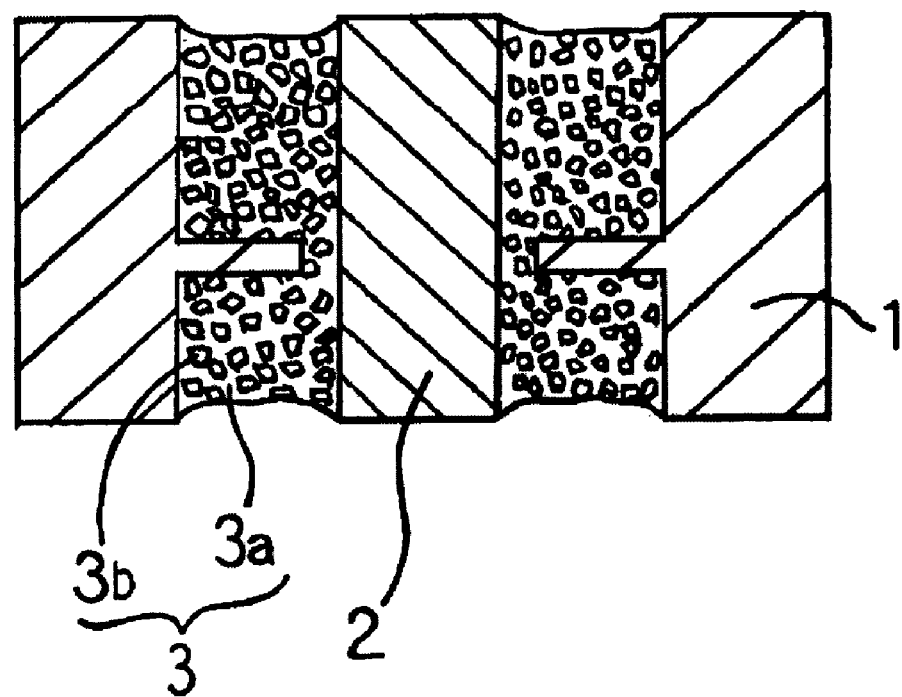
FIG. 19 is a cross-sectional view of a base structure for mounting a light emitting element, according to one embodiment of the present invention, including a connection member having protruding portions.
Figure 20:
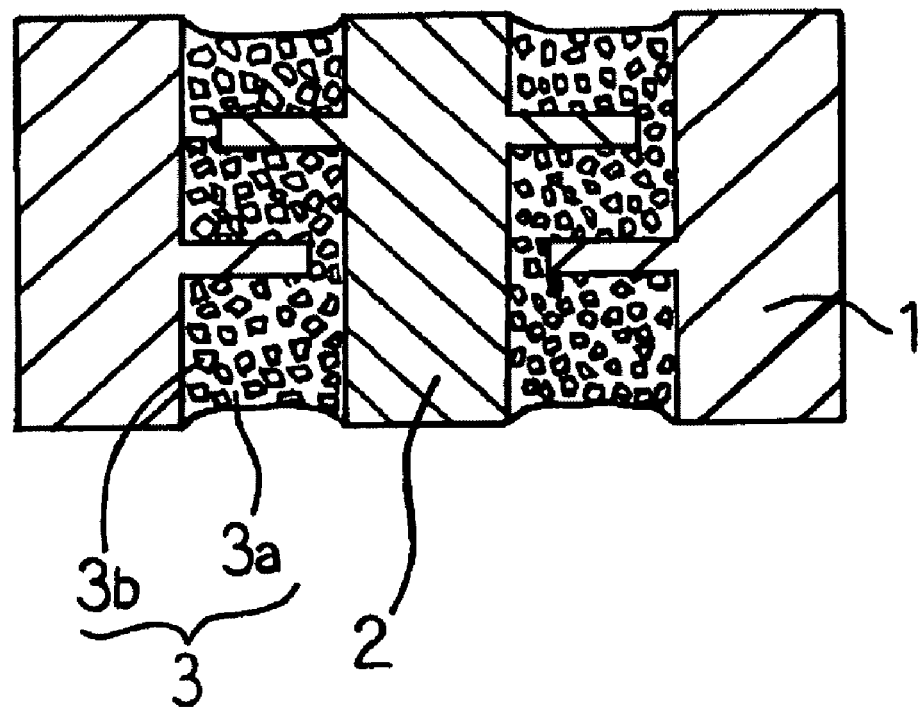
FIG. 20 is a cross-sectional view of a base structure for mounting a light emitting element, according to one embodiment of the present invention, in which a connection member and a supporting metallic member have protruding portions.

FIG. 3 is a cross-sectional view of a light emitting element mounting base structure according to another embodiment of the present invention. Another preferred example is a structure in which a flange-like protruding portion 2a is provided on the outer circumferential surface of a supporting metallic member 2 and the protruding portion 2a is embedded in the filler member 3, as shown in FIG. 3. Thereby, the supporting metallic member 2 is more tightly held by the filler member 3 and is prevented from being shifted in the longitudinal direction. Furthermore, the supporting metallic member 2 does not easily slip in a direction perpendicular to the centerline thereof. Furthermore, since the supporting metallic member 2 and the filler member 3 are tightly held to each other, the supporting metallic member 2 and the filler member 3 are not easily separated from each other. Since the creeping distance between the top and bottom of the supporting metallic member 2 increases, sealing between the supporting metallic member 2 and the filler member 3 is not easily broken. Furthermore, the protruding portion 2a can also have a function of preventing light from being transmitted through the filler member 3 and leaking from the lower surface of the filler member 3. Alternatively, for example, the central portion of the supporting metallic member 2 may be thinned down, the upper half and the lower half of the supporting metallic member 2 may be configured so as to have different sizes, or a cylindrical portion and a prismatic portion may be combined. FIGS. 16, 17, 18A and 18B are plan views of base structures having various shapes. In the base structure of FIG. 16, the connection member 1 and the supporting metallic member 2 have cylindrical shapes. The supporting metallic member 2 may have a polygonal prism shape as in FIG. 17. Furthermore, as illustrated in FIGS. 18A and 18B, a through hole having a polygonal prism shape may be formed in the connection member 1 and the filler member 3 may be applied to fill the gap separating the supporting metallic member 2 from the connection member 1. Also, with respect to the inner circumferential surface of the connection member 1, preferably, the upper portion and the lower portion are configured so as to have different shapes when viewed in plan. For example, a protruding portion projecting from the inner circumferential surface may be provided for the connection member 1. FIG. 19 is a cross-sectional view of a base structure including such a connection member 1 having protruding portions. FIG. 20 is a cross-sectional view of another base structure, in which a connection member 1 and a supporting metallic material 2 have protruding portions buried in the filler member 3. Also, a groove-like recess may be provided along the inner circumferential surface, or the connection member 1 may be configured so as to have a shape in which different shapes of cross-section are combined. Furthermore, if a groove that is perpendicular to the circumferential direction of the through hole is formed in the outer circumferential surface of the protruding portion 2a or the supporting metallic member 2, or the inner circumferential surface of the through hole of the connection member 1, when the light emitting device according to this embodiment is screwed into a socket, the filler member 3 and the inner circumferential surface of the supporting metallic member 2 or the connection member 1 become not easily separated from each other by external forces during screwing. Furthermore, heat generated by the light emitting element 6 can be efficiently dissipated from the lower surface of the base structure by the supporting metallic member 2. The increase in the temperature of the light emitting element 6 is suppressed and the performance of the light emitting element 6 can be stably maintained for a long period of time. As necessary, a plurality of supporting metallic members 2 may be disposed inside the through hole. In such a case, a light emitting element 6 may be mounted on each of the upper surfaces of the supporting metallic members 2. Two supporting metallic members 2 may be used as a pair, a light emitting element 6 may be mounted on the upper surface of one supporting metallic member 2, and the other supporting metallic member 2 may be used as a line conductor that supplies an electric current to the light emitting element 6. Furthermore, the upper surface of the supporting metallic member 2 may be processed so as to have a shape that is the same as or slightly smaller than the shape of the lower surface of the light emitting element 6, and thereby light emitted downward from the side face of the light emitting element 6 is not blocked by the upper surface of the supporting metallic member 2. The lower end portion of the supporting metallic member 2 may be processed so as to have a thicker shape than the upper portion, and thereby the heat transfer property of the supporting metallic member 2 is improved. Furthermore, the lower end of each supporting metallic member 2 may be connected to a metal plate so that the individual supporting metallic members 2 are electrically connected to each other, and the light emitting elements 6 are connected in parallel.

Figure 4:
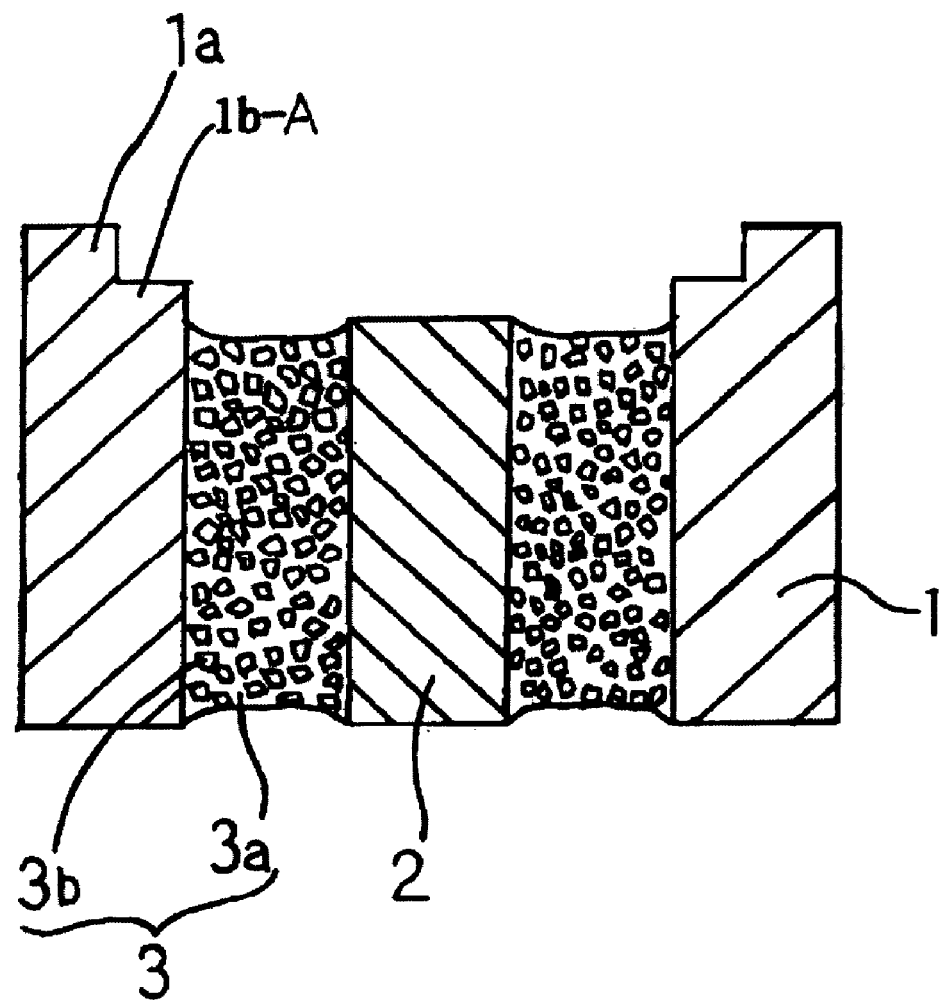
FIG. 4 is a cross-sectional view of a base structure for mounting a light emitting element, according to another embodiment of the present invention.

FIG. 4 is a cross-sectional view of a base structure for mounting a light emitting element, according to another embodiment of the present invention. As shown in FIG. 4, a protruding portion 1a may be provided on the whole outer side of the upper surface of the connection member 1. Thereby, radiant light from the light emitting device can be easily aligned in a certain direction and emitted. Furthermore, when the light transmitting resin layer 5, etc. are provided on the upper surface of the base structure, the resin layer can be held by the protruding portion 1a. Thus, the light emitting device can be fabricated more easily. In addition, since a step (shoulder 1b-A) that allows wire bonding is present inside the protruding portion 1a of the connection member 1, the difference between the height of the upper surface of the light emitting element 6 and the height of the shoulder 1b-A of the connection member 1 can be decreased. Thereby, the wire bonding process can be carried out more easily and reliably.

Figure 5:
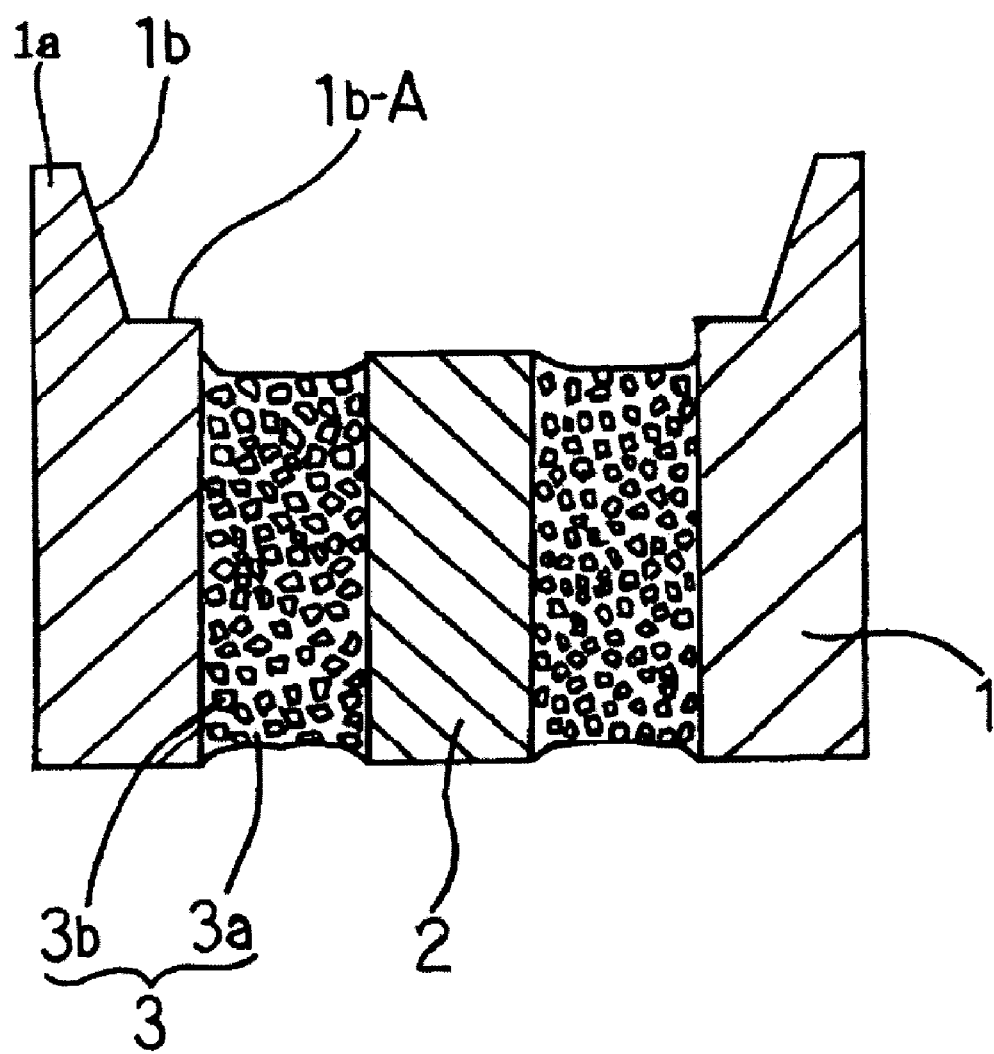
FIG. 5 is a cross-sectional view of a base structure for mounting a light emitting element, according to another embodiment of the present invention.

FIG. 5 is a cross-sectional view of a base structure for mounting a light emitting element, according to another embodiment of the present invention. As shown in FIG. 5, the protruding portion 1a preferably has an inner surface which is a slanting surface 1b slanting outward from the bottom end portion toward the top end portion. By allowing the slanting surface 1b to function as a light reflection plane, the luminance of the light emitting device can be improved. One electrode of the light emitting element 6 is electrically connected to the shoulder 1b-A inside the slanting surface 1b through a bonding wire 7 or the like. The shoulder 1b-A extending inward from the bottom end portion of the slanting surface 1b may be disposed around the whole or partial periphery of the through hole of the connection member 1. When the shoulder 1b-A is partially disposed, the area of the filler member 3 can be further increased, and the light reflection area of the filler member 3 can be increased.

Figure 15:
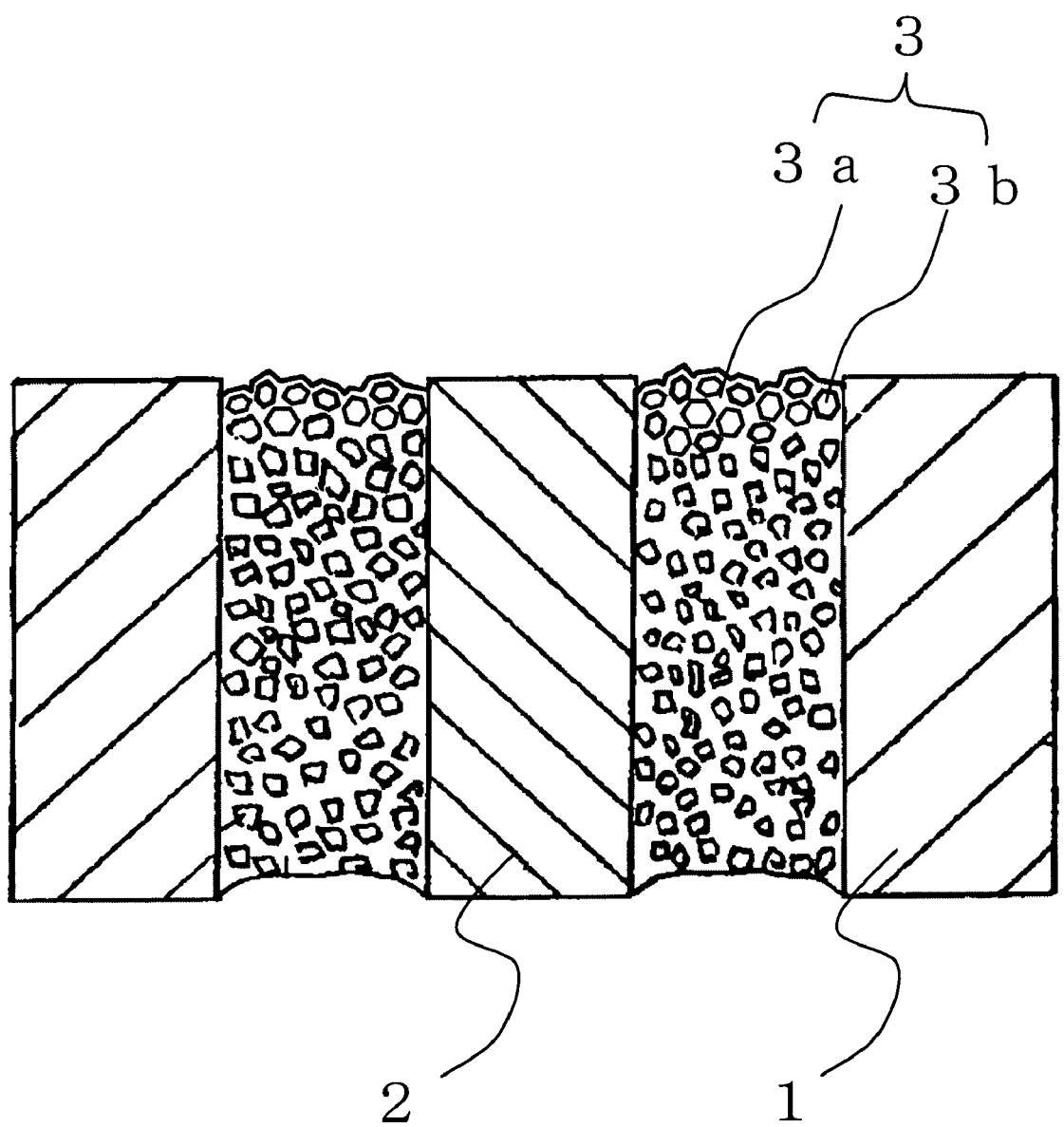
FIG. 15 is a cross-sectional view of a base structure for mounting a light emitting element, including a filler member having an irregular surface.
Figure 16:
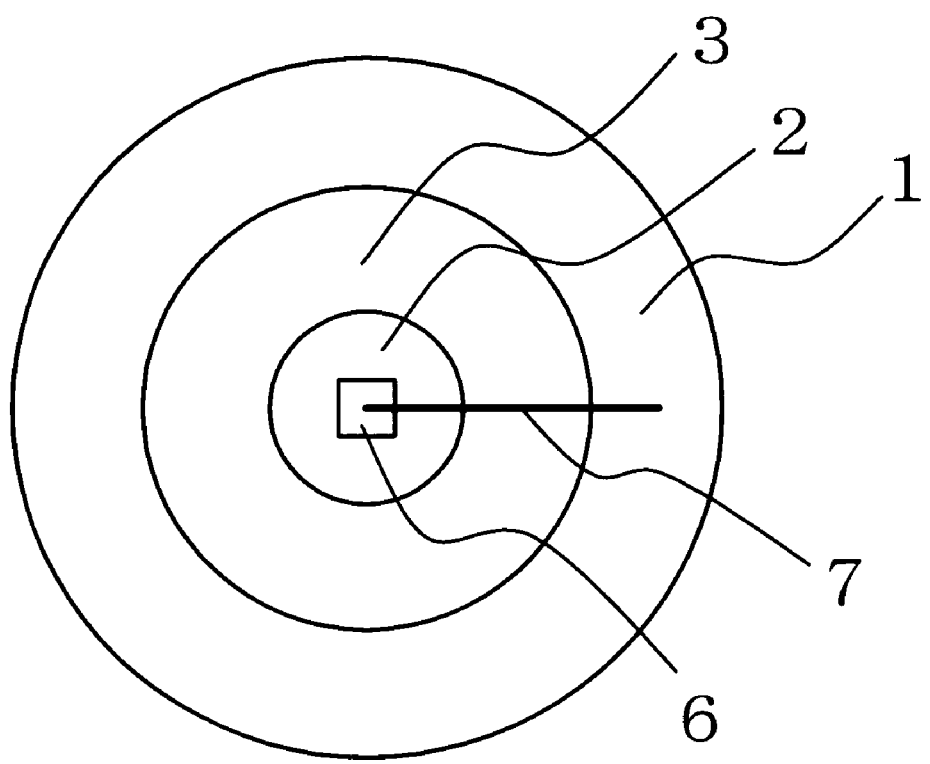
FIG. 16 is a top plan view of a base structure for mounting a light emitting element, according to one embodiment of the present invention.
Figure 17:
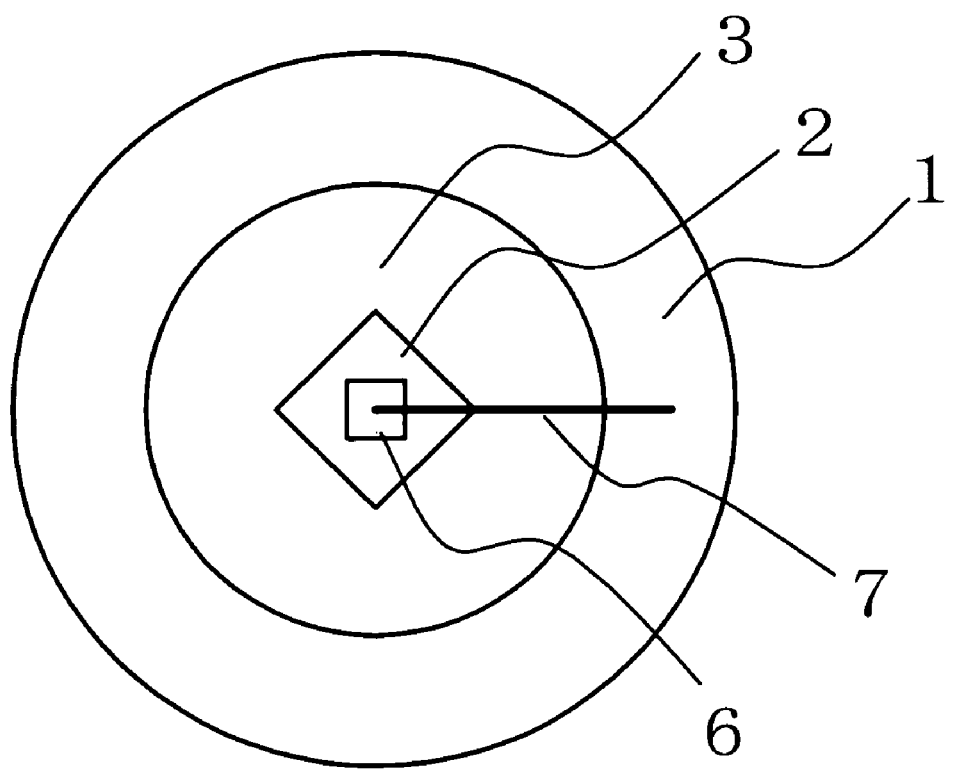
FIG. 17 is a top plan view of a base structure for mounting a light emitting element, according to another embodiment of the present invention.

The filler member 3 includes a particulate material 3b or a mixture of particulate materials 3b, dispersed in a transparent resin 3a. The transparent resin 3a is, for example, composed of a highly heat-resistant silicone resin. The particulate material 3b may be crystalline or polycrystalline and contain, as a main component, an inorganic substance such as titanium oxide (titania: $TiO_2$), zinc oxide (ZnO), barium sulfate ($BaSO_4$), zirconium oxide ($ZrO_2$), diamond, aluminum oxide ($Al_2O_3$), calcium oxide (CaO), and magnesium oxide (MgO). The particulate material 3b has an average particle size of 0.5 to 3 μm. The surface of the filler member 3 is not a flat plane because the particulate material 3b which contributes to reflection is present near the surface. The surface area of the filler member 3 is substantially significantly large compared with a surface in which no particulate material 3b is present. Thereby, light is reflected diffusely from the surface of the filler member 3, and the occurrence of irregular color in the light emitting device can be decreased. In such a case, the shape of the meniscus of the surface composed of only the transparent resin 3a is changed to an irregular plane due to the presence of the particulate material 3b, and the particulate material 3b may or may not be exposed from the transparent resin 3a. FIG. 15 is a schematic illustration showing a cross-sectional view of a base structure including such a filler member 3 having an irregular upper surface because of the particulate material 3b. Furthermore, the filler member 3 also functions as an insulating member that insulates the supporting metallic member 2 from the connection member 1.

Such a filler member 3 is prepared by a method in which the particulate material 3b and the transparent resin 3a are mixed with mixing means, such as a kneader, the resulting mixture is injected with feeding device, such as a syringe, into a space between the inner surface of the through hole of the connection member 1 and the outer circumferential surface of the supporting metallic member 2, and then heating is performed at a predetermined heating temperature for solidification. It may be, of course, possible to insert a component molded into a predetermined shape in advance into the space between the supporting metallic member 2 and the connection member 1. The mixed amount of the particulate material 3b is determined appropriately according to the particle shape, etc., so as to optimize the reflectance of the filler member 3. The average particle size of the particulate material 3b is determined from the particle size distribution of the particulate material measured by a centrifugal sedimentation light transmission method (in which a change in the concentration distribution in a suspension prepared by suspending a particulate material and left to stand is detected as a change in the amount of transmitted light over time, and the particle size distribution is measured according to the Stokes equation), a laser diffraction scattering method (in which the particle size distribution is measured based on the intensity of light scattered when a laser beam is applied to a particulate material and the scattering angle according to the Mie theory), or a laser Doppler method (in which the velocity of Brownian motion of fine particles is detected, and the particle size distribution is measured by the velocity distribution). In the particle size distribution of the particulate material thus measured, the particle size at which a cumulative percentage of 50% is attained is defined as an average particle size.

Since the refractive index of the particulate material 3b is far greater than the refractive index of its surrounding transparent resin 3a, light incident on the particulate material 3b is totally reflected with high efficiency inward by a surface opposite to the plane of incidence of the particulate material 3b according to Snell's law. The totally reflected light is emitted toward the upper surface of the base structure, thus contributing to an increase in the luminance of the light emitting device. That is, the amount of light that enters and is absorbed by the particulate material 3b or that passes through the particulate material 3b and advances toward the lower surface of the base structure decreases, and the light emitted from the light emitting element 6 is efficiently used to produce radiant light of the light emitting device. For the reason described above, the particulate material 3b is preferably composed of a material having a refractive index higher than that of the transparent resin 3a (e.g., silicone resin with refractive index n=1.4), such as $TiO_2$ (n=2.8), ZnO (n=2.0), $ZrO_2$ (n=2.1), or diamond (n=2.4), from the standpoint that a large angle of total reflection is ensured. Titanium oxide is more suitable than others in terms of its large refractive index. Furthermore, $Al_2O_3$ (n=1.7) and $BaSO_4$ (n=1.6), which have been described above, have a slightly large refractive index, and these materials may also be used. In addition, powder with white color that easily reflects light or a color close to white may also be used as the particulate material 3b. Here, the term "angle of total reflection" means an angle or a range of angles larger than the angle (critical angle) between incident light and the normal to the interface at which the light incident from the particulate material 3b on the interface with the transparent resin 3a ceases to advance toward the transparent resin 3a. The critical angle depends on the difference in refractive index between the transparent resin 3a and the particulate material 3b. As the difference in refractive index between the transparent resin 3a and the particulate material 3b increases, the critical angle at which incident light can be totally reflected decreases. Consequently, by using a particulate material 3b with a higher refractive index and a transparent resin 3a with a lower refractive index, light is totally reflected more readily at the interface between the transparent resin 3a and the particulate material 3b, and thus a filler member 3 with a higher reflectance can be obtained. Furthermore, in order to increase the probability that incident light is totally reflected, the particulate material 3b preferably has an irregular shape, such as a plate-like or columnar shape, rather than a spherical shape. Furthermore, preferably the particle size of the particulate material 3b is larger than a quarter of a wavelength of incident light and as small as possible so that a filler member 3 having a high reflectance can be obtained. If the particle size of the particulate material 3b is smaller than a quarter of a wavelength of incident light, the particle size is excessively small and the number of diffuse reflections in the mixture of the transparent resin 3a and the particulate material 3b excessively increases. As a result, light is not easily reflected in the mixture of the transparent resin 3a and the particulate material 3b. If the particle size of the particulate material 3b is excessively large, the number of particles of the particulate material 3b contained in the transparent resin 3a is decreased, and the amount of the particulate material 3b per volume of the filler member 3 is decreased. As a result, the area of the reflection plane occurring between the particulate material 3b and the transparent resin 3a decreases. Therefore, preferably, the particle size of the particulate material 3b is larger than a quarter of a wavelength of light and as small as possible. Furthermore, with respect to powdered $TiO_2$, since the color is white and the refractive index is large, light emitted from a light emitting element 6 is satisfactorily reflected. Thus, powdered $TiO_2$ is suitable for increasing the luminance of the light emitting device (B1). With respect to powdered ZnO, since the light absorption spectrum is in the range of 420 to 720 nm, light (380 to 400 nm) emitted from a blue-light-emitting element 6 is satisfactorily reflected. Thus, powdered ZnO is suitable for increasing the luminance of the light emitting device (B1). Furthermore, $BaSO_4$ also satisfactorily reflects light (380 to 400 nm) emitted from the blue-light-emitting element 6, and thus is suitable for increasing the luminance of the light emitting device (B1). This also applies to the other materials, i.e., $ZrO_2$, diamond, $Al_2O_3$, CaO, and MgO. Furthermore, the inorganic material is preferably selected according to the wavelength of light to be reflected in view of light absorption (transmittance). For example, while preferable in view of the refractive index, $TiO_2$ has a property of absorbing light at a wavelength of about 350 nm in the near-ultraviolet region. $ZrO_2$ has a remarkable light absorption property in the short-wavelength region below 400 nm. Therefore, in order to form a filler member 3 so as to reflect near-ultraviolet light with a wavelength of about 350 nm, it is preferable to use $Al_2O_3$ (aluminum oxide) that does not readily absorb near-ultraviolet light.

The refractive index of the particulate material 3b can be determined by the Becke line method. In the Becke line method, a particulate material 3b is set on a preparation, a dispersion liquid is dropped thereon, and the Becke lines generated inside and outside of the edge of the particulate material 3b are visually observed using a microscope. During the observation, the tube of the microscope is raised or lowered, and the refractive index of the dispersion liquid is adjusted until the Becke lines are confirmed. Based on the refractive index of the dispersion liquid, the refractive index of the particulate material 3b is determined. Furthermore, the refractive index of the transparent resin 3a can be determined by the refractive index measurement method for plastic (JIS K7142). The contents of JIS K7142 are incorporated herein by reference in their entirety. It may also be possible to use the Becke line method mentioned above or an immersion test method in which the refractive index of a material is measured using immersion liquids with varied refractive indices.

As the transparent resin 3a to be mixed into the filler member 3, for example, a silicone resin, an epoxy resin, or a polycarbonate resin is used. A transparent resin material is usually used as the transparent resin 3a. However, the transparent resin 3a is not necessarily transparent as long as the above-mentioned intention is achieved. For example, it may be possible to use a resin that has a low light absorption property but is not transparent because of its light scattering property or a resin in which a light-scattering material is mixed. When the transparent resin 3a to be mixed with the filler member 3 is a silicone resin, for example, the filler member 3 including an uncured silicone resin is injected into the space between the supporting metallic member 2 and the connection member 1, and heat treatment is performed at 150° C. for about 40 minutes to cure the silicone resin. As a result, the filler member 3 tightly holds the supporting metallic member 2 inside the connection member 1. Note that the filler member 3 is applied so as not to adhere to the upper surface of the supporting metallic member 2 and the upper surface of the connection member 1. Preferably, the surface of the filler member 3 is concave, as shown in FIG. 1. Thereby, the area of the reflection plane can be increased and reflected light is prevented from being dispersed, resulting in an increase in the luminance of the reflected light. When the light emitting element 6 is joined to the upper surface of the supporting metallic member 2, a gold-tin (Au—Sn) brazing filler material (brazing temperature: about 280° C.) or the like is used. Since the brazing time is shorter, the silicone resin or the like is not altered or deteriorated, and the initial adhesion strength is maintained without any problems. When the transparent resin 3a is an epoxy resin, the heat treatment temperature is, for example, 100° C. and the allowable temperature limit is about 230° C. at a maximum. Therefore, as a joining material for joining the light emitting element 6 to the upper surface of the supporting metallic member 2, preferably, a low-temperature solder with a melting temperature of about 200° C. to 210° C. is used.

Figure 6:
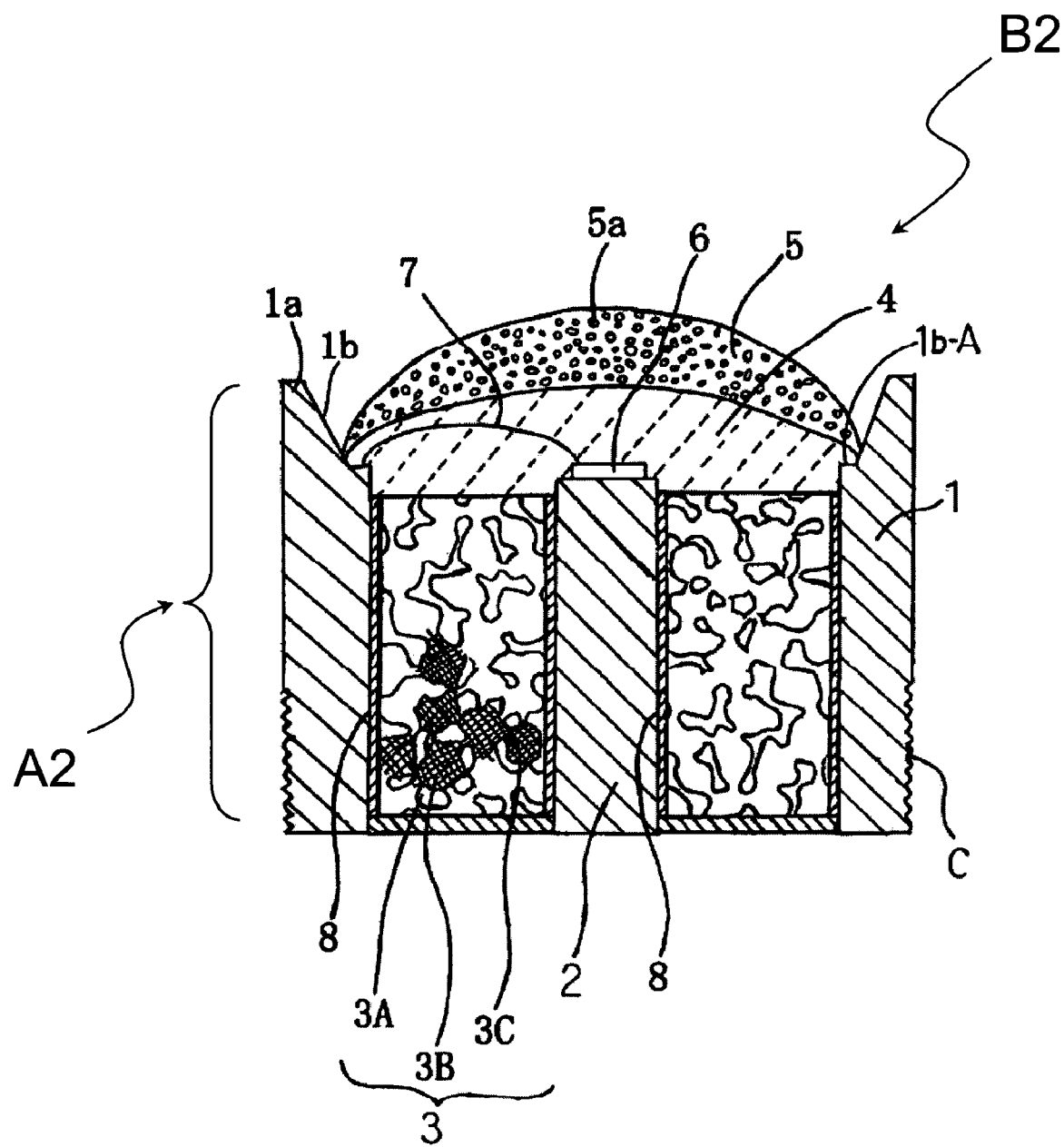
FIG. 6 is a cross-sectional view of a light emitting device according to another embodiment of the present invention.
Figure 7:
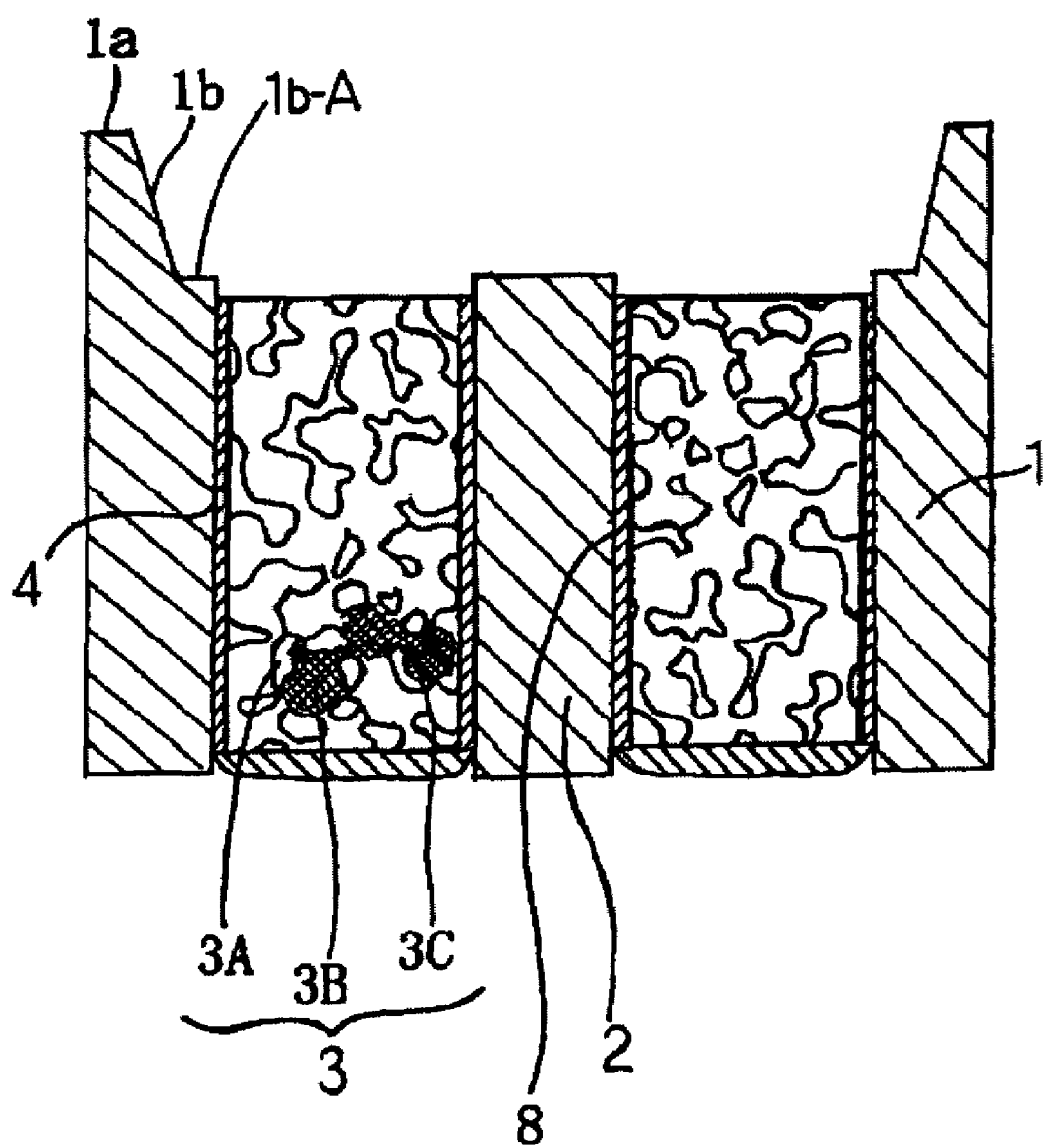
FIG. 7 is a cross-sectional view of a base structure for mounting a light emitting element, provided in the light emitting device shown in FIG. 6.
Figure 8:
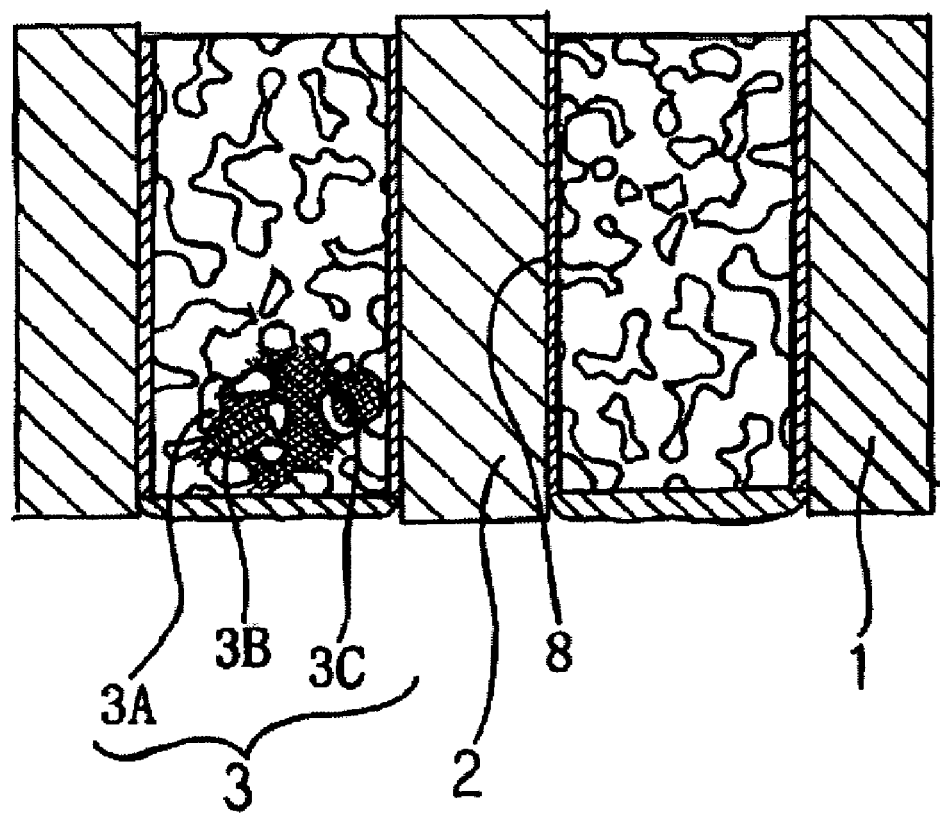
FIG. 8 is a cross-sectional view of a base structure for mounting a light emitting element, according to another embodiment of the present invention.
Figure 9:
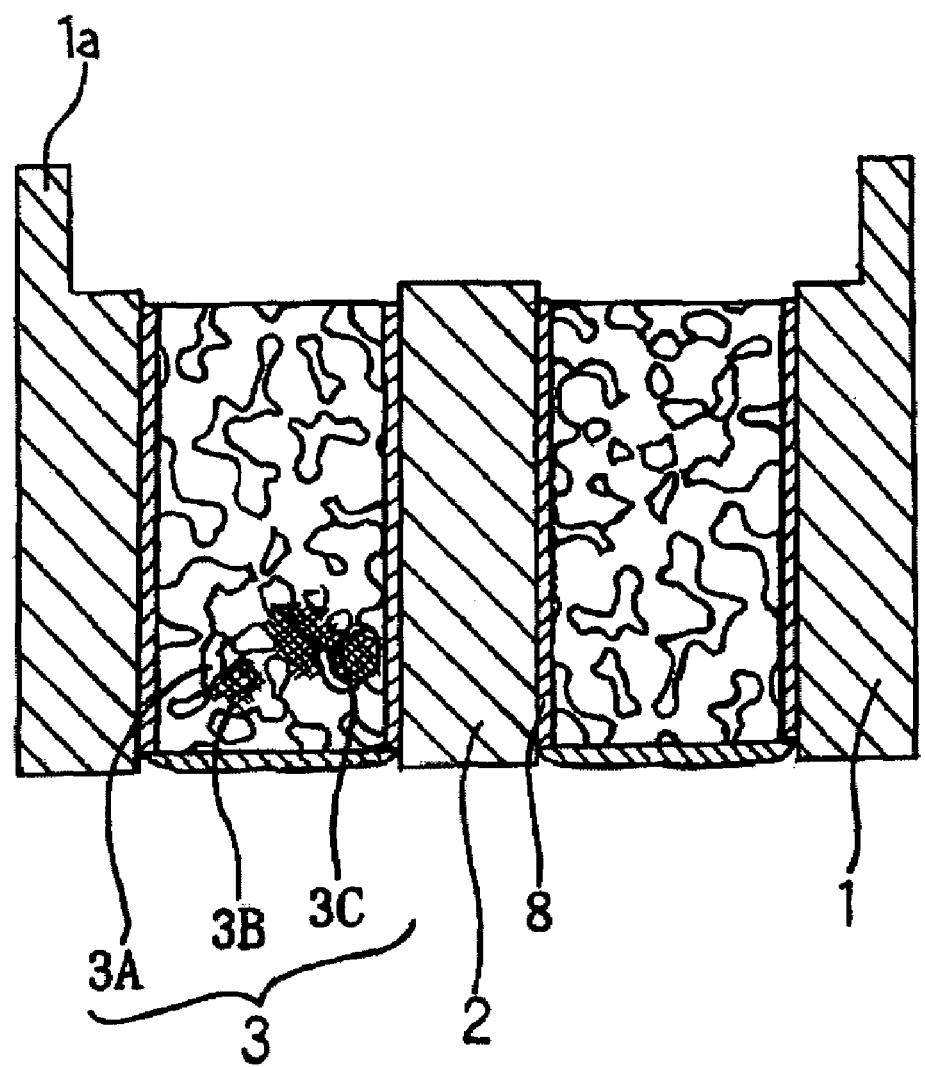
FIG. 9 is a cross-sectional view of a base structure for mounting a light emitting element, according to another embodiment of the present invention.

FIG. 6 is a cross-sectional view of a light emitting device (B2) according to another embodiment of the present invention, and FIG. 7 is a cross-sectional view of a base structure (A2) provided in the light emitting device (B2). Elements common to FIGS. 1 to 5 are represented by the same reference numerals. FIGS. 8 and 9 are each a cross-sectional view of a base structure for mounting a light emitting element, according to another embodiment of the present invention. As in the cases shown in FIGS. 1 to 5 in which the filler member 3 including the transparent resin 3a and the particulate material 3b is used, the base structures shown in FIGS. 8 and 9 may be used.

The light emitting device (B2) shown in FIG. 6 includes a resin bonding material 8 which bonds the filler member 3 to the supporting metallic member 2. Furthermore, the filler member 3 has a tubular shape and includes a porous inorganic material 3B near its upper surface located around the surface of the supporting metallic member 2 on which the light emitting element 6 is mounted. Specifically, the filler member 3 is porous in which a plurality of particles of the inorganic material (i.e., inorganic particles) 3B are partially combined with each other to form many voids 3A (hereinafter also referred to as "pores 3A"). More specifically, the filler member 3 is in a porous state in which the inorganic particles 3B are combined with each other at the contracted or necked solid solution portions 3C, and the voids 3A are formed between adjacent inorganic particles 3B. The voids 3A are filled with a gas (e.g., air) or a transparent material having a lower refractive index than the inorganic material 3B. Preferably, the voids 3A are filled with a gas (air). Furthermore, preferably, the inorganic material 3B is a non-metallic material. If the inorganic material 3B is a metal, light may not be readily transmitted through the inorganic material 3B and may be confined in the voids, and thus the loss of light might be increased.

The filler member 3 composed of such a porous inorganic material 3B is produced, for example, using a calcined body obtained by calcining an inorganic material 3B. Note that the term "calcining" means incomplete firing for forming a porous body with an adequate porosity, which is different from a sintered body, such as a ceramic, in which substantially no voids are present between inorganic particles (porosity: about 0.001% to 1%).

Alternatively, the filler member 3 may be a porous body in which inorganic particles 3B are bonded to each other with a binder. Such a porous body may be obtained by forming a material including inorganic particles 3B, a binder, and a solvent into a predetermined shape, and then volatilizing the solvent. The binder used in this case remains in the porous body. Therefore, in order to suppress a decrease in reflectance resulting from light absorption in the binder, a binder having a light transmitting property is preferably used. Examples of the binder which may be used include resin binders, such as epoxy resins, silicone resins, fluorocarbon resins, acrylic resins, urea resins, methacrylic resins, and polycarbonate resins; and glass binders, such as low-melting glass, sol-gel glass, and silicon (Si)—Mg—Al—O glass. Alternatively, a filler member 3 may be produced by applying a material including inorganic particles 3B, a binder, and a solvent to an upper surface (on the side where the light emitting element 6 is mounted) of a nonporous member.

The inorganic material 3B preferably has an average particle size of 0.5 to 3 μm and is preferably composed of powder containing, as a main component, for example, one of $TiO_2$, $ZrO_2$, $Al_2O_3$, ZnO, CaO, MgO, and $BaSO_4$, or a mixture of such powders. That is, for example, when a light emitting device and a base structure for mounting a light emitting element are used for a lighting apparatus which emits white light, preferably, the inorganic material 3B has low absorption for white light, i.e., light in a predetermined region. For example, the inorganic material 3B preferably has an absorptance of 5% or less for light in the visible region. When used for a lighting apparatus which uses ultraviolet light, near-ultraviolet light, or blue light as a light source, and emits white light by subjecting the entire or a part of the light to wavelength conversion with a phosphor or the like, preferably the inorganic material 3B is white and has an absorptance of 5% or less for ultraviolet light, near-ultraviolet light, or blue light emitted from the light source, and for the light converted by the phosphor or the like. The light absorptance can be determined as the complement of the reflectance measured using a spectrophotometer (CM-3700d manufactured by Minolta, reference light source: D65, wavelength range: 360 to 740 nm, field of view: 100, mask: MAV). That is, the light absorptance can be determined by subtracting the total reflectance (%) of the inorganic material from 100%.

In the base structure (A2) provided with the filler member 3 composed of the porous inorganic material 3B according to this embodiment, a part of light is reflected from the surface of an inorganic material 3B. When the remainder that is transmitted through the inorganic material 3B is incident on the interface between the inorganic material 3B and a void 3A at an angle larger than the critical angle, incident light is totally reflected from the interface. When the angle of incidence at the interface between the inorganic material 3B and the void 3A is smaller than the critical angle, incident light is transmitted through the void 3A and partially reflected by the surface of an inorganic material 3B lying ahead, and the rest of the light is transmitted through the inorganic particle 3B. When an interface between an inorganic material 3B and a void 3A lie further ahead of the optical path of the transmitted light and the angle of incidence with respect to the interface is larger than the critical angle, the incident light is totally reflected by the interface. In the filler member 3, a reflection phenomenon is believed to occur due to the occurrence of the phenomenon described above, which is the same as that in the case of the mixture of the transparent resin 3a and the particulate material 3b described above. Thereby, it is possible to obtain a filler member 3 having a higher reflectance.

In the fabrication of a filler member 3 which utilizes the total reflection phenomenon at the interfaces between the particles of the inorganic material 3B and the voids 3A, since light is transmitted repeatedly through the inorganic material 3B, the inorganic material 3B is preferably composed of a material that is transparent as much as possible to light. For example, because of its high refractive index, $TiO_2$ has a wider range of angles of total reflection with respect to incident light, and when $TiO_2$ is used for the filler member 3, high reflectance is more easily achieved. However, because of its property of absorbing light at a wavelength of about 410 to 350 nm in the near-ultraviolet region, when $TiO_2$ is used for a filler member 3 that reflects light at a wavelength of about 410 to 350 nm in the near-ultraviolet region, the effect of improving light reflectance is small. On the other hand, since $Al_2O_3$ does not easily absorb light at a wavelength of about 350 nm, $Al_2O_3$ is more suitable for a filler member 3 that reflects light at a wavelength of about 350 nm in the near-ultraviolet region. Duplicate description of the properties of the inorganic material 3B which are common to those of the particulate material 3b mentioned above will be omitted here.

In the case where the filler member 3 is composed of a calcined body, since the inorganic material 3B is not viscous although it has a high refractive index and high transmittance, in order to connect particles of the inorganic material 3B to each other, the particles of the inorganic material 3B are preferably formed into a calcined body. The calcined body is produced as follows.

First, particles of the inorganic material 3B with an adequate particle size and shape are mixed with a base material, such as a resin. For example, a mixture of the inorganic material 3B and an acrylic resin, a paraffin resin, or a polyethylene resin is placed into a mold and pressed into a shape required for a calcined body.

Subsequently, the resin in the calcined body is removed by evaporation with heat or by burning. For instance, the acrylic resin, the paraffin resin, the polyethylene resin, or the like is evaporated at about 500° C.

Subsequently, in order to subject particles of the inorganic material 3B to solid solution partially to combine the particles of the inorganic material 33 to each other partially, firing is performed for a short period of time at a temperature that does not completely sinter the inorganic material 3B. In order to decrease the sintering temperature and time, a sintering additive, such as silicon oxide (SiO or SiO$_2$), CaO, or MgO, that decreases the sintering temperature by forming solid solution with or chemically combining with the component of the inorganic material 3B may be added. For example, when Al$_2$O$_3$ is used as the inorganic material 3B, about 0.1% to 10% by mass of silicon dioxide (SiO$_2$), CaO, or MgO may be added as a sintering additive.

In a typical ceramic, firing is performed completely such that substantially no voids 3A are present between particles of the inorganic material 3B and the particles are combined. However, according to this embodiment, unlike the complete firing, as shown in FIGS. 6, 7, 8, and 9, firing is terminated in a porous state in which particles of the inorganic material 3B are combined with each other at the contracted or necked solid solution portions 3C, and the voids 3A are formed between adjacent particles of the inorganic material 3B. Herein, such incomplete firing is referred to as semi-firing. In FIGS. 6, 7, 8, and 9, for simplification, only a part of the inorganic material 3B in the filler member 3 is crosshatched.

When the inorganic material 3B is aluminum oxide, in order to allow the particles of the inorganic material 3B to partially form solid solution, firing is performed at about 1,000° C. to 1,400° C. If firing is performed at a temperature lower than 1,000° C., formation of solid solution between the particles of the inorganic material 3B does not easily proceed. The resulting calcined body tends to be very brittle, and the deflecting strength (bending strength) thereof measured by the bending test method for fine ceramics stipulated in JIS R1601 is less than 1 MPa. Thus, particles easily fall off when the surface of the calcined body is rubbed. Consequently, although high reflectance is achieved, in order to use the calcined body for a light emitting device, a separate measure is preferably employed.

When firing is performed at a temperature higher than 1,400° C., sintering of the particles of the inorganic material 3B proceeds and a calcined body in which substantially no voids 3A are present is obtained. As a result, the area of interfaces that contribute to light reflection decreases, and the reflectance of the calcined body tends to decrease. In such a case, the flexural strength is 300 MPa. Although the strength is sufficient, transparency is imparted to the calcined body, and the reflectance tends to decrease.

When firing is performed at 1,000° C. to 1,400° C., particles of the inorganic material 3B adequately form solid solution and voids 3A are also produced. Thus, the resulting calcined body has strength sufficient for use in a lighting apparatus and high reflectance. In such a case, the flexural strength is 1 MPa to 300 MPa. Even if the surface of the calcined body is rubbed, particles do not fall off. The surface of the calcined body is white. Since the difference in the refractive index between the particles of the inorganic material 3B and the voids 3A is large, it is possible to increase the angle of total reflection at the interfaces therebetween. Thus, a larger amount of light is reflected, and transmission does not easily occur.

When the inorganic material 3B is CaO or MgO, a part thereof is consumed as a sintering additive. However, since the remainder functions as a porous inorganic material 3B for reflecting light, the light reflection is not affected.

Furthermore, since the number of reflection interfaces is one of the factors that control the reflectance of the calcined body, preferably, the number of reflection interfaces per unit volume is as large as possible. That is, by allowing many interfaces between particles of the inorganic material 3B and voids 3A to be present per unit volume, a calcined body with high reflectance can be obtained.

The filler member 3 is preferably formed to have a porosity of 15% to 43% so that the transmitted light entering inside is reflected and emitted at high probability. The reason for this is that if the porosity is unduly low, the number of voids 3A (or pores 3A) is low, and the number of reflection interfaces contributing to light reflection is low (i.e., the internal surface area is small), resulting in a decrease in reflectance, and that if the porosity is unduly high, the strength of the filler member 3 is decreased.

Figure 10:
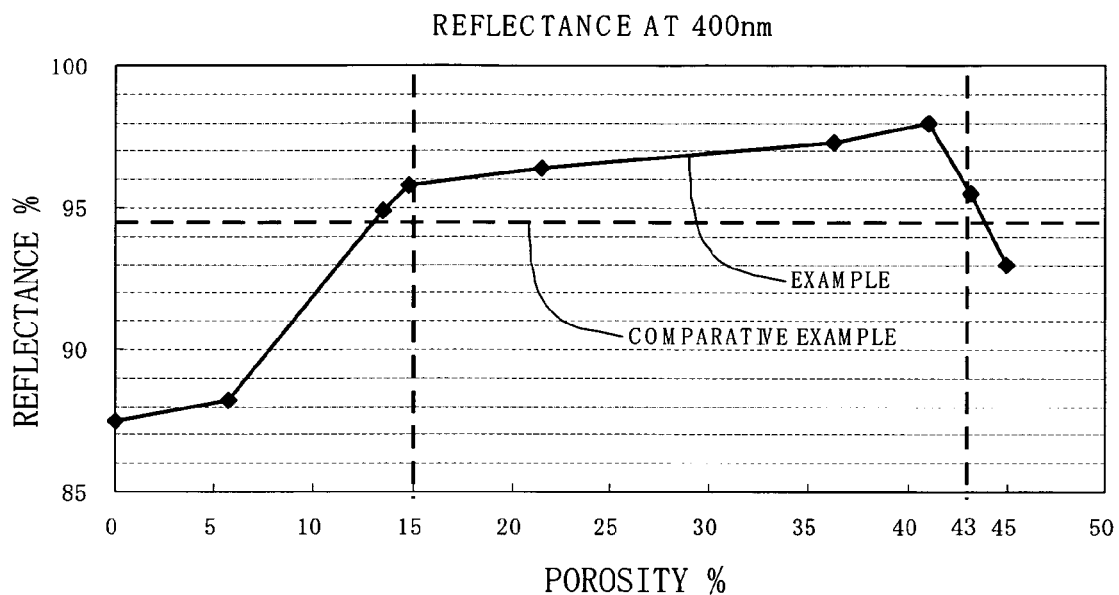
FIGS. 10A and 10B are graphs showing the relationship between the porosity of the filler member and reflectance at 400 nm and the relationship between the porosity of the filler member and reflectance at 600 nm, respectively.
Figure 10:
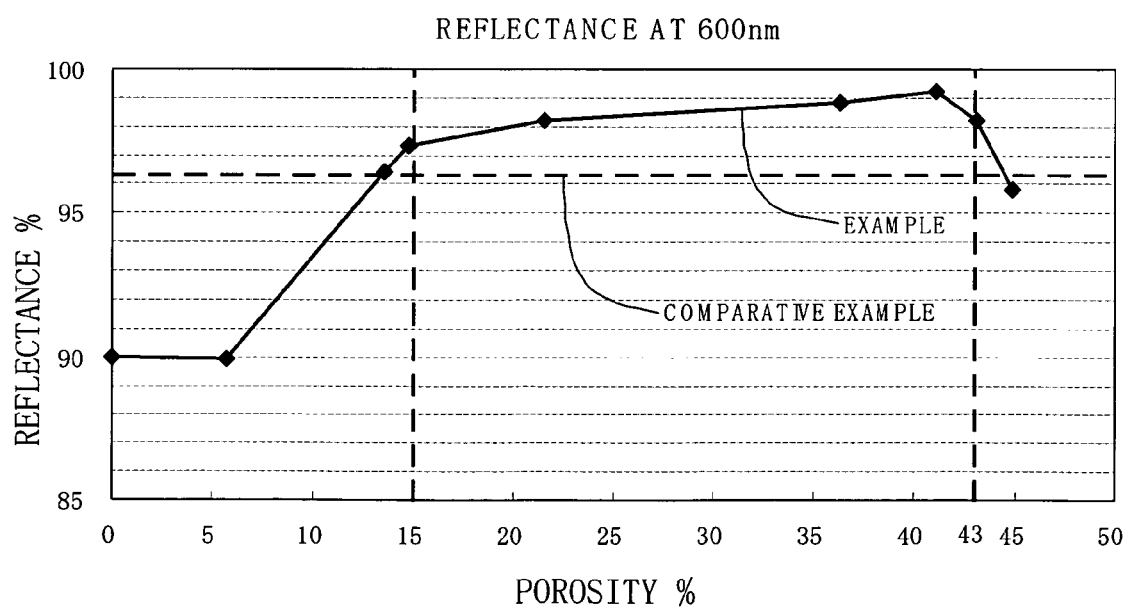

FIG. 10A is a graph showing the relationship between the porosity and reflectance at 400 nm in filler members, and FIG. 10B is a graph showing the relationship between the porosity and reflectance at 600 nm in filler members. As is evident from FIGS. 10A and 10B, with respect to the reflection members (filler members) in which alumina particles are used as an inorganic material 3B, regardless of the measurement wavelength, high reflectance is exhibited at a porosity in the range of 10% to 45%. In particular, at a porosity in the range of 15% to 43%, reflectance that is higher than the reflection standard (trade name: "Spectralon") manufactured by Labsphere, Inc. is exhibited. Therefore, when the reflection member is formed using alumina, the porosity is preferably set in the range of 15% to 43%.

Note that the reflectance was measured using a spectrophotometer (CM-3700D manufactured by Minolta). Light from a xenon lamp was reflected by a surface of each sample and the intensity of reflected light was measured at a measurement wavelength of 400 nm or 600 nm, and the intensity ratio between the incident light and the reflected light was calculated to determine the reflectance. Herein, the porosity is defined by the following formula:

$$\text{Porosity (\%)} = \left[1 - \frac{\text{Bulk density}}{\text{True density}}\right] \times 100$$

In the above formula, the bulk density can be determined by the Archimedes method, and the true density can be determined by the vapor phase substitution method (pycnometer method). Furthermore, when the porous portion is thin, a cross section of the reflection layer is observed with a microscope, and the area ratio of the pores 3A in the cross section is calculated (by dividing the total sum of the areas of pores by the total area). The resulting area ratio of the pores 3A is raised to the 3/2 power to obtain a porosity.

Since the filler member 3 is composed of the porous inorganic material 3B, the reflectance is not substantially degraded even if exposed to light for a long period of time. For example, in a lighting apparatus including a light emitting element 6 as a light source, the filler member 3 can be used as a light reflection member that performs stably for a long period of time. Furthermore, by selecting Al$_2$O$_3$ for the inorganic material 3B, it is possible to obtain a calcined body having high reflectance even in the near-ultraviolet region with a wavelength of about 350 nm. Thus, if such a filler member 3 is used for an LED light emitting device including a near-ultraviolet light emitting element 6, a highly efficient LED lighting apparatus can be obtained.

With respect to the surface of the calcined body, since the inorganic material 3B that contributes to reflection is present near the surface of the light emitting element mounting side of the filler member 3, light emitted from the light emitting element 6 can be diffusely reflected in an efficient manner by the surface of the calcined body, and thus the occurrence of irregular color in the light emitting device can be further decreased.

The filler member 3 composed of a porous inorganic material 3B, such as a calcined body, formed into a shape placeable between the connection member 1 and the supporting metallic member 2 is, for example, as shown in FIG. 6, inserted into the space between the connection member 1 and the supporting metallic member 2 and fixed with a resin bonding material 8. Furthermore, by covering the surface of the filler member 3 composed of the porous inorganic material 3B opposite to the light emitting element mounting side surface with the same resin binder 8 or a different sealing resin, the sealing property of the filler member 3 can be improved. As the resin bonding material 8, an appropriate organic resin, such as an epoxy resin, an acrylic resin, or a silicone resin, that exhibits satisfactory adhesiveness to the porous inorganic material 3B, the connection member 1, and the supporting metallic member 2 is used.

Figure 11:
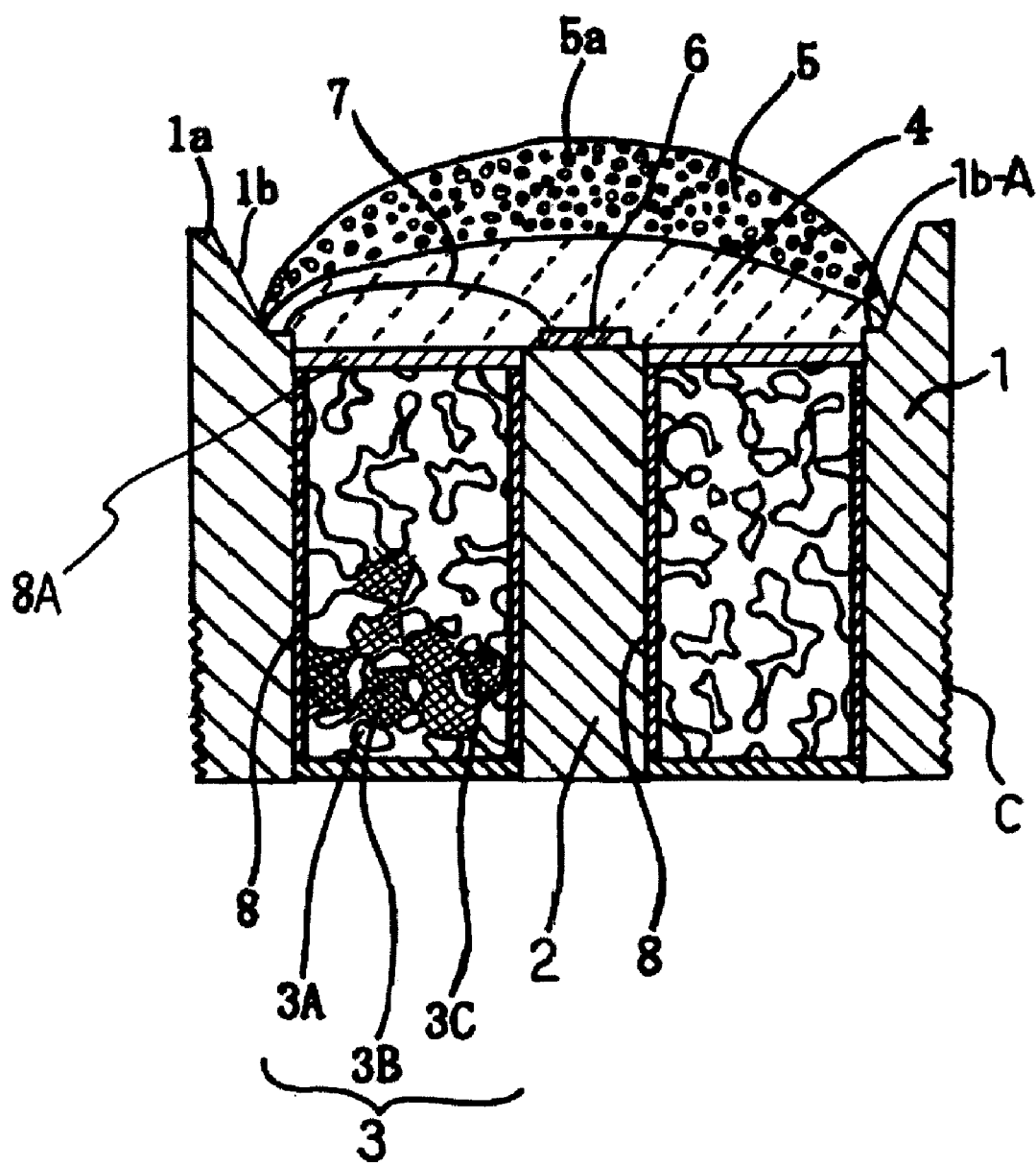
FIG. 11 is a cross-sectional view of a light emitting device according to another embodiment of the present invention.

FIG. 11 is a cross-sectional view of a light emitting device according to another embodiment of the present invention. As shown in FIG. 11, more preferably, a transparent member 8A is attached to the element mounting side surface of a filler member 3 composed of a porous inorganic material 3B. Thereby, the porous inorganic material 3B can be sealed at the element mounting side. In this way, for example, it is possible to prevent an uncured transparent resin layer 4 that has been applied to cover a light emitting element 6 from penetrating into the porous inorganic material 3B. If the transparent resin layer 4 penetrates into the voids 3A in the porous inorganic material 3B, the difference in the refractive index between the porous inorganic material 3B and the voids 3A is decreased, and light is not efficiently reflected upward by the interfaces between the transparent resin layer 4 and the porous inorganic material 3B. In contrast, according to this embodiment, the amount of light that is emitted from the light emitting element 6 and reflected by the filler member 3 toward outside of the light emitting device is not decreased. Consequently, since the transparent member 8A is attached to the element mounting side surface of the filler member 3, the amount of light reflected by the filler member 3 is increased, and optical output and luminous efficiency are improved in the light emitting device.

Figure 12:
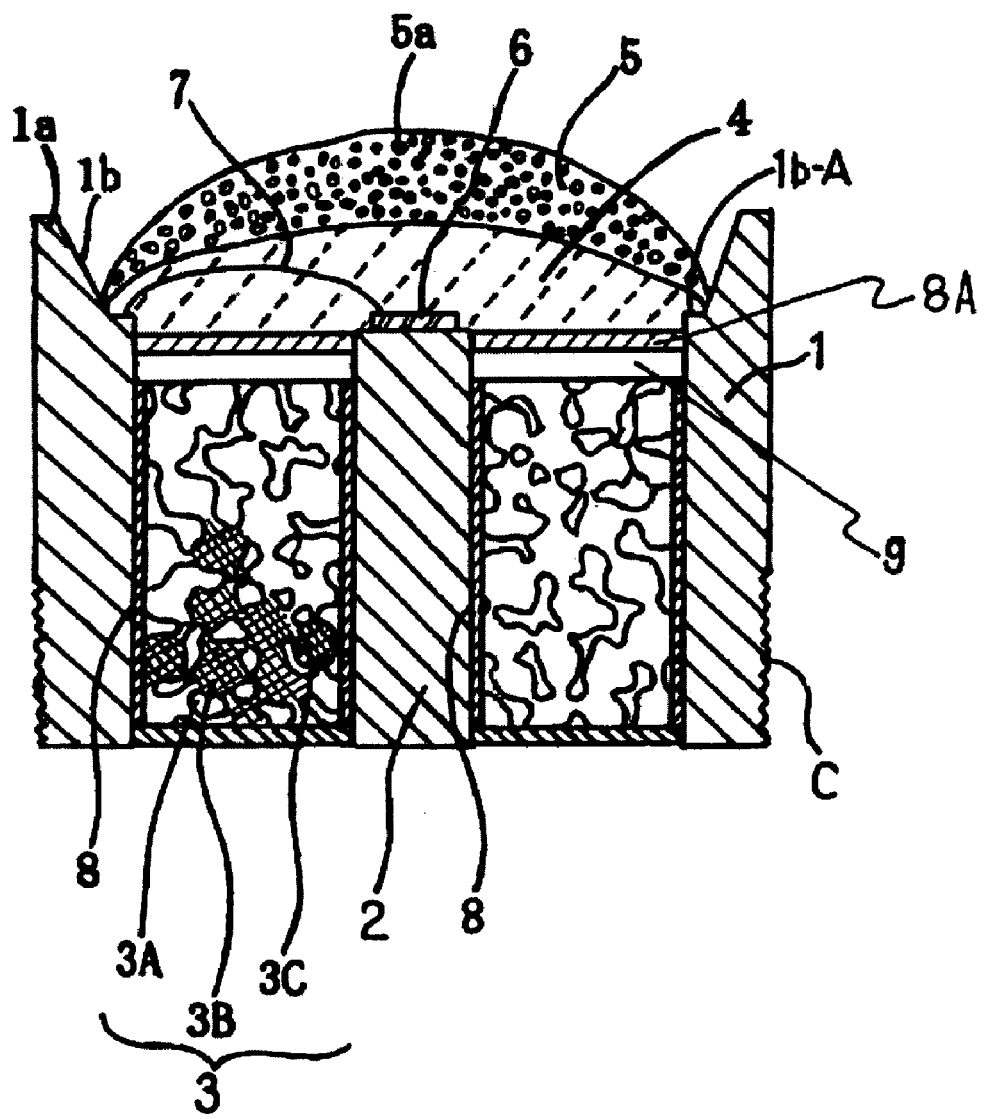
FIG. 12 is a cross-sectional view of a light emitting device according to another embodiment of the present invention.

FIG. 12 is a cross-sectional view of a light emitting device according to another embodiment of the present invention. As shown in FIG. 12, more preferably, a void space 9 is provided between the transparent member 8A and the porous inorganic material 3B. Thereby, light emitted downward from the light emitting element 6 is transmitted through the transparent member 8A and a part of light is totally reflected upward from the interface with the void space 9 according to Snell's law.

For example, when a quartz glass with a refractive index of about 1.46 is used as the transparent member 8A and the void space 9 is filled with air with a refractive index of about 1, the critical angle $\theta_1$ at an interface between the transparent member 8A and the void space 9 is about 43° ($\theta_1=\sin^{-1}(1/1.46)$). Light incident on the interface between the transparent member 8A and the void space 9 at an angle larger than the critical angle is totally reflected at the interface and emitted outside as radiant light. As described above, in the base structure for mounting a light emitting element, according to this embodiment, since the void space 9 is provided between the transparent member 8A and the inorganic material 3B, the reflectance to the light emitted downward from the light emitting element 6 is improved, and the optical output and luminous efficiency of the light emitting device are improved.

With regard to the light emitting devices shown in FIGS. 11 and 12, the filler member 3 composed of a porous inorganic material 3B has been described as an example. It may be also possible to dispose the transparent member 8A on the element mounting side surface of the filler member 3 in which the particulate material 3b is incorporated into the transparent resin 3a shown in any one of FIGS. 1 to 5, and in such a case, the same effect as that described above can be obtained.

Furthermore, it is preferable to appropriately select, as the transparent member 8A, a material that has a high transmittance to the light from the light emitting element 6 and a refractive index greatly different from that of the void space 9. For example, when light with short wavelength and high energy, including light in the range from the ultraviolet region to the blue region, is emitted from the light emitting element 6, it may be possible to use a material that has high transmittance to such light and has excellent weatherability and long time reliability, for example, a transparent glass, such as quartz glass or an optical glass containing boric acid and silica; a transparent inorganic material composed of quartz crystal, sapphire, fluorite, or the like; or a transparent resin, such as a silicone resin, an epoxy resin, or a fluorocarbon resin.

When light with a long wavelength and low energy, including light in the range from the blue region to the red region, is emitted from the light emitting element 6, it may be possible to use a material that has high transmittance to such light and has excellent weatherability and long time reliability, for example, a transparent resin, such as a silicone resin, an epoxy resin, a polycarbonate resin, an acrylic resin, or a fluorocarbon resin; a transparent glass, such as quartz glass or an optical glass containing boric acid and silica; or a transparent inorganic material composed of quartz crystal, sapphire, fluorite, or the like.

Preferably, the transparent member 8A has a refractive index lower than that of the transparent resin layer 4. Thereby, a part of light emitted from the light emitting element 6 is totally reflected upward at the interface between the transparent resin layer 4 and the transparent member 8A according to Snell's law. Furthermore, a part of light transmitted through the transparent member 8a is reflected upward at the interface between the transparent member 8A and the porous inorganic material 3B shown in FIG. 11, at the interface between the transparent member 8A and the void space 9 or between the inorganic material 3B and the void space 9 shown in FIG. 12, or at the interface between the transparent member 8A and the filler member 3 in which the particulate material 3b and the transparent resin 3a are mixed. As a result, light reflected upward at each interface is efficiently emitted outside from the top of the light emitting device, and thus the optical output and luminous efficiency of the light emitting device are improved.

The transparent member 8A is fabricated by forming a resin by die molding, such as transfer molding or injection molding such that a through hole into which the supporting metallic member 2 is inserted and fixed is formed in the center, or by subjecting a transparent member 8A formed in a plate shape to cutting or punching. The transparent member 8A is bonded and fixed to the supporting metallic member 2 or the connection member 1 and disposed above the filler member 3 composed of the porous inorganic material 3B or the filler member 3 in which the particulate material 3b and the transparent resin 3a are mixed. When the transparent member 8A is composed of a transparent adhesive resin, the material used for the resin bonding material 8 may also be used as the transparent member 8A.

Furthermore, the void space 9 is preferably filled with an inert gas. For example, by enclosing an inert gas composed of argon, nitrogen, helium, or the like, the oxidation reaction of each of the connection member 1 and the supporting metallic member 2 can be inhibited, a decrease in reflectance is suppressed, and the light emitting device is allowed to operate efficiently for a long period of time.

In the filler member 3, a layer of calcined body may be formed on the surface of a member, for example, composed of a metal, a ceramic, or a resin, by bonding or the like.

Figure 13:
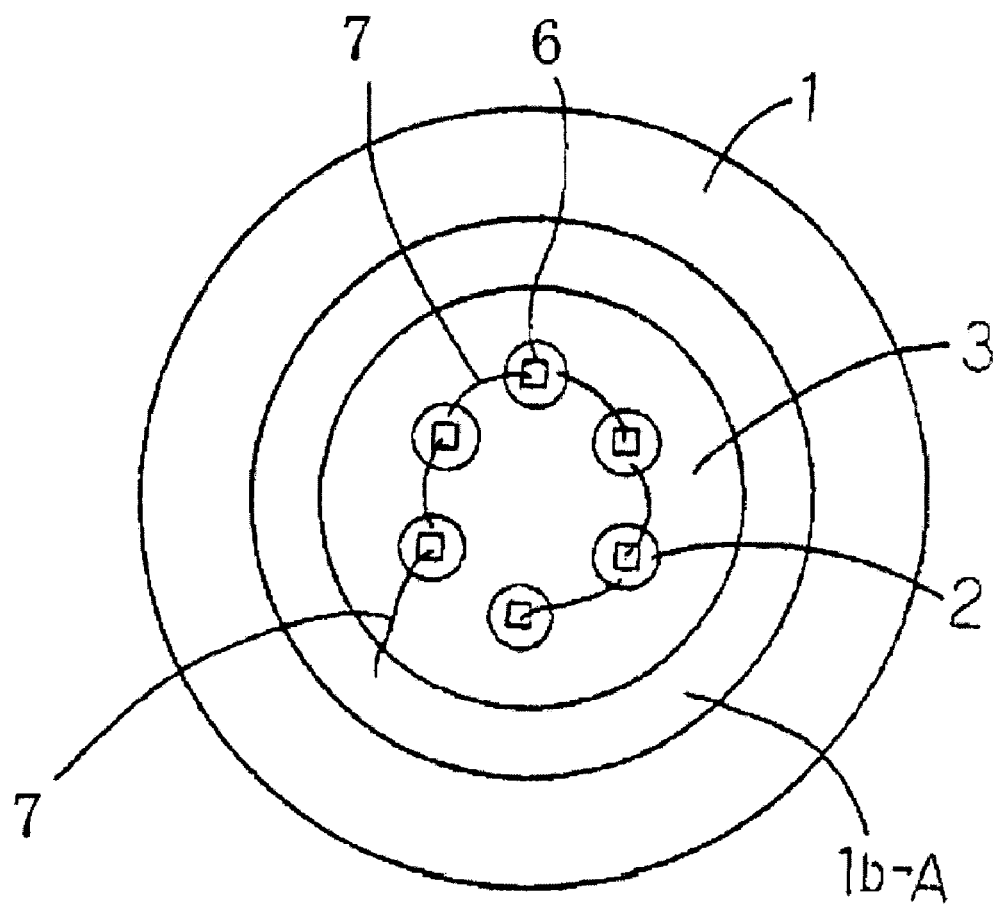
FIG. 13 is a plan view of a light emitting device according to another embodiment of the present invention.
Figure 14:
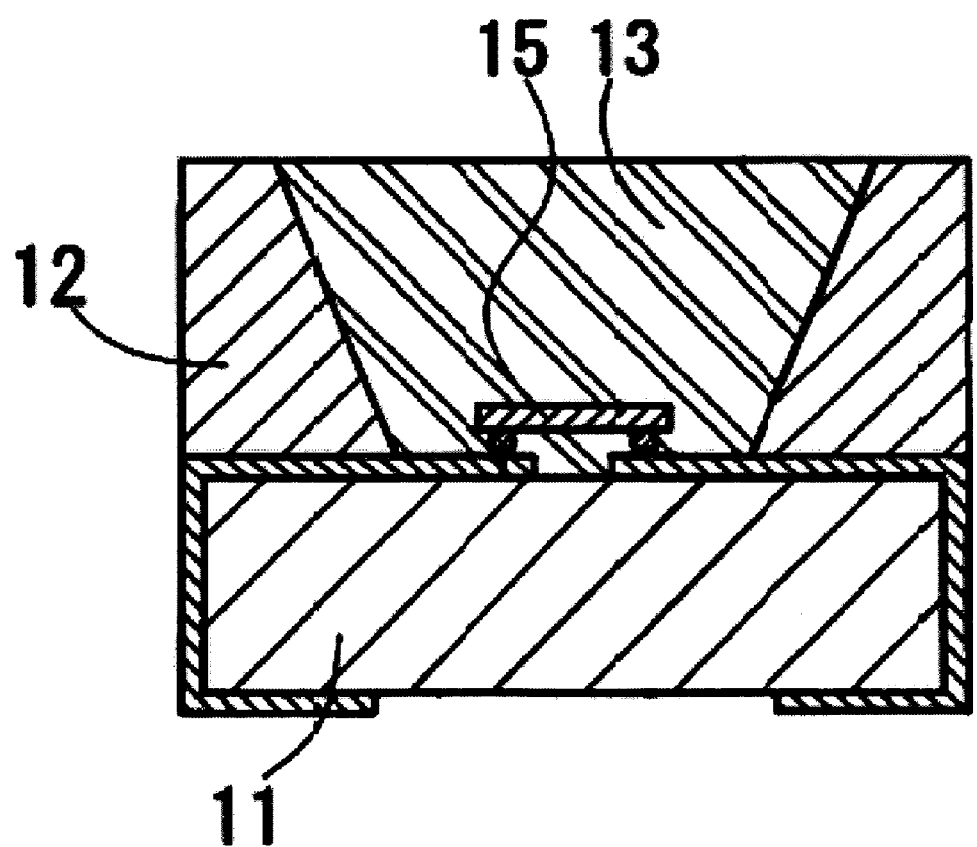
FIG. 14 is a cross-sectional view of a light emitting device according to a background art.

FIG. 13 is a plan view of a light emitting device according to another embodiment of the present invention. In addition to the case in which one light emitting element 6 is used as a light source, by providing a plurality of supporting metallic members 2 in a light emitting element mounting base structure, a plurality of light emitting elements 6 may be disposed in a predetermined pattern. Thereby, the light emitting device can be used for a high-intensity lighting apparatus. For example, in a plan view, by arranging light emitting elements 6 in a lattice pattern, in a staggered pattern in which light emitting element rows are shifted by predetermined intervals, in a radial pattern, in a circular pattern, in a polygonal pattern, or the like, it is possible to fabricate a lighting apparatus capable of producing high luminance. In such a case, with respect to the connection between the light emitting elements 6, for example, when six light emitting elements 6 are arranged, as shown in FIG. 13, which is a plan view of a light emitting device, the electrodes on the upper surfaces of the six light emitting elements are connected by bonding wires 7, and the electrode of the last light emitting element 6 is connected to the connection member 1. Thus, the light emitting elements 6 can be very easily connected in series. If the light emitting elements 6 are connected in series, the electric current flowing through each light emitting element 6 has the same value, and each light emitting element 6 has the same emission intensity, which is advantageous. Of course, it is also possible to connect the individual light emitting elements 6 in parallel, an electrode of each light emitting element 6 being connected to the connection member 1 through a bonding wire 7. Thereby, even if one light emitting element 6 fails to operate properly, the remaining elements are prevented from going down.

In the light emitting device described above according to one embodiment of the present invention, the emission characteristic is improved, and problems are alleviated, such as a decrease in light emission efficiency of the light emitting element because of thermal degradation caused by an increase in the temperature of the light emitting element, and occurrence of irregular color in the radiant light. Furthermore, since light reflectance at the upper principal surface of the base structure is higher, the luminance of light emitted from the light emitting device is improved.

Furthermore, a base structure for mounting a light emitting element, according to an embodiment of the present invention, includes a connection member, a supporting metallic member disposed inside the connection member, the upper end of the supporting metallic member being a light emitting element mounting portion, and a filler member disposed between the supporting metallic member and the connection member. Since the light emitting element is mounted on the upper surface of the supporting metallic member as such, heat generated by the light emitting element can be efficiently guided to the lower side of the base structure through the supporting metallic member. Thereby, it is possible to suppress a decrease in luminous efficiency or occurrence of irregular color of emitted light due to an increase in the temperature of the light emitting element.

Furthermore, since the connection member is disposed so as to surround the supporting metallic member and the filler member, light emitted from the light emitting element mounted on the upper end of the supporting metallic member is prevented from leaking out from the side face of the connection member after being transmitted through the filler member. Thereby, the contrast between the light emitting device using the base structure according to the present embodiment and its surrounding area is improved, thus increasing visibility.

Furthermore, the supporting metallic member and the connection member disposed around the supporting metallic member through the filler member are allowed to function as conductors for the electrical connection of the light emitting device. Moreover, since the filler member is disposed between the supporting metallic member and the connection member, the light emitting device can be satisfactorily sealed.

Furthermore, in a base structure for mounting a light emitting element, according to an embodiment of the present invention, in the configuration described above, preferably, the filler member includes a transparent resin and a particulate material having a higher refractive index than that of the transparent resin. Consequently, light from the light emitting element entering inside the filler member without being reflected by the surface of the filler member is reflected by the surface of the particulate material having a higher refractive index than that of the transparent resin. Light that has entered the particulate material is totally reflected by the interface between the particulate material and its surrounding transparent resin with substantially no energy loss, and emitted toward the upper surface of the base structure. Thus, the filler member functions as a reflection member which efficiently reflects light emitted from the light emitting element, and it is possible to provide a base structure for a light emitting device having high luminous efficiency.

Furthermore, a base structure for mounting a light emitting element, according to an embodiment of the present invention, includes a supporting metallic member, the upper end thereof being a light emitting element mounting portion, and a filler member disposed around the supporting metallic member, the filler member including a transparent resin and a particulate material having a higher refractive index than that of the transparent resin, the filler member being provided at a distance from a light emitting element so that the surface of the filler member is irradiated with light emitted by the light emitting element. Thereby, light emitted toward the surrounding area from the light emitting element mounted on the upper end of the supporting metallic member can be reflected by the surface of the filler member disposed to surround the supporting metallic member and emitted toward the upper surface of the light emitting element mounting base structure. Moreover, since the filler member includes the transparent resin and the particulate material having a higher refractive index than that of the transparent resin, the filler member functions as an efficient reflection member. Consequently, it is possible to provide a base structure for a light emitting device having high luminous efficiency.

Furthermore, in a base structure for mounting a light emitting element, according to an embodiment of the present invention, in the configuration described above, preferably, the particulate material is present on or in the vicinity of the surface of the filler member. Because of the particulate material present on the surface of the transparent resin, the surface of the filler member is not a flat plane, and light is reflected diffusely from the surface of the filler member. Thereby, irregular color of the light emitting device and irregular illumination on the irradiation surface can be suppressed.

Furthermore, in a base structure for mounting a light emitting element, according to an embodiment of the present invention, in the configuration described above, preferably, the particulate material contains titanium oxide as a main component, and the transparent resin includes at least one of an epoxy resin, a polycarbonate resin, and a silicone resin. Because the particulate material contains, as a main component, titanium oxide having a much larger refractive index than that of an epoxy resin, a polycarbonate resin, or a silicone resin, the reflection characteristics of the filler member can be improved. Moreover, since titanium oxide does not absorb visible light or ultraviolet light, good reflection characteristics can be exhibited.

Furthermore, in a base structure for mounting a light emitting element, according to an embodiment of the present invention, in the configuration described above, preferably, the particulate material contains zinc oxide as a main component, and the transparent resin includes at least one of an epoxy resin, a polycarbonate resin, and a silicone resin. Because of the particulate material containing, as a main component, zinc oxide having a much larger refractive index than that of an epoxy resin, a polycarbonate resin, or a silicone resin, the reflection characteristics of the filler member can be improved. Moreover, since zinc oxide does not absorb light in the wavelength range from visible light to blue light, favorable reflection characteristics can be exhibited.

Furthermore, in a base structure for mounting a light emitting element, according to an embodiment of the present invention, in the configuration described above, preferably, the particulate material contains zirconium oxide as a main component, and the transparent resin includes at least one of an epoxy resin, a polycarbonate resin, and a silicone resin. Because of the particulate material containing, as a main component, zirconium oxide having a much larger refractive index than that of an epoxy resin, a polycarbonate resin, or a silicone resin, the reflection characteristics of the filler member can be improved.

Furthermore, in a base structure for mounting a light emitting element, according to an embodiment of the present invention, in the configuration described above, preferably, the particulate material contains barium sulfate or aluminum oxide as a main component, and the transparent resin includes at least one of an epoxy resin, a polycarbonate resin, and a silicone resin. Because of the particulate material having a larger refractive index than that of an epoxy resin, a polycarbonate resin, or a silicone resin, the reflection characteristics of the filler member can be improved. Moreover, since barium sulfate or aluminum oxide does not absorb light in the wavelength range from visible light to blue light, good reflection characteristics can be exhibited.

Furthermore, in a base structure for mounting a light emitting element, according to an embodiment of the present invention, in the configuration described above, preferably, the particulate material includes at least one of a particulate material containing titanium oxide as a main component, a particulate material containing zinc oxide as a main component, a particulate material containing barium sulfate as a main component, a particulate material containing zirconium oxide as a main component, a particulate material containing diamond as a main component, a particulate material containing aluminum oxide as a main component, a particulate material containing calcium oxide as a main component, and a particulate material containing magnesium oxide as a main component, and the transparent resin includes at least one of an epoxy resin, a polycarbonate resin, and a silicone resin. Consequently, light entering the filler member is efficiently reflected from the surface of the particulate material having a large refractive index and high reflectance toward the upper surface of the base structure, without further proceeding downward. Thus, the reflectance of light emitted from the light emitting element is higher, and it is possible to provide a base structure for a light emitting device with high luminous efficiency.

Furthermore, in a base structure for mounting a light emitting element, according to an embodiment of the present invention, at least one of a supporting metallic member and a connection member has a protrusion extending in the circumferential direction and embedded in a filler member. Thereby, it is possible to prevent the filler member from being detached from the supporting metallic member or the connection member. Moreover, since the protrusion increases the contact area between the supporting metallic member or the connection member and the filler member, fixing of the supporting metallic member or the connection member to the filler member is ensured. It is also possible to increase heat dissipation through the filler member, and an increase in the temperature of the light emitting element can be suppressed. Furthermore, light transmitted through the filler member is blocked by the protrusion and the amount of light leakage can be decreased.

Furthermore, in a base structure for mounting a light emitting element, according to an embodiment of the present invention, in the configuration described above, preferably, the filler member is composed of a porous inorganic material in at least a mounting side portion disposed around the position where the light emitting element is mounted. Since the inorganic material absorbs less light with a specific wavelength than a resin, the attenuation of light energy decreases.

Furthermore, the filler member is porous in which, for example, a plurality of inorganic particles are partially combined with each other to form pores (voids) between the inorganic particles. Consequently, not only a light wave component or the like can be reflected by the surface of the filler member, but also a wave component that has entered the filler member can be totally reflected by the interface between the internal surface of the inorganic material and the void. That is, by filling the voids with a gas, such as air, or a transparent material that has a lower refractive index than that of the inorganic particles, because of the difference in the refractive index between the inorganic material and the material filled, the incident wave component can be totally reflected at the interfaces (reflection planes) therebetween. Furthermore, by forming a porous filler member with an adequate porosity, adequate voids (pores) are formed in the filler member, and it becomes possible to secure many reflection planes in the filler member. Thereby, the filler member can efficiently reflect the wave component that has entered the filler member. As a result, very high reflectance can be achieved at the surface and inside of the filler member.

Furthermore, a filler member having a reflection layer composed of an inorganic substance has higher light resistance and heat resistance than a reflection member (filler member) with a reflection layer mainly composed of an organic substance. Consequently, in the filler member of the base structure according to this embodiment, a decrease in reflectance due to degradation of the material is reduced, and a high sealing property is also achieved.

Furthermore, by forming a reflection layer by combining inorganic particles, it is possible to obtain a filler member (reflection member) having sufficient strength such that the inorganic particles do not fall off.

Furthermore, in a base structure for mounting a light emitting element, according to an embodiment of the present invention, the filler member has a porosity of 15% to 43% at the mounting surface side portion. Since the number of voids (pores) present is not unduly high, satisfactory strength of the filler member is ensured. The area of the interfaces (reflection planes) between the internal surfaces of the inorganic material and voids is not unduly decreased. As a result, a filler member having high strength and high reflectance can be produced.

Furthermore, in a base structure for mounting a light emitting element, according to an embodiment of the present invention, more preferably, a transparent member is attached to the element mounting side of the filler member. Thereby, the porous inorganic material can be sealed at the element mounting side. In this way, for example, it is possible to prevent an uncured transparent resin layer that has been applied to cover a light emitting element from penetrating into the porous inorganic material. If the transparent resin layer penetrates into the pores in the porous inorganic material, the difference in the refractive index between the porous inorganic material and the pores is decreased, and light is not efficiently reflected upward by the interface between the transparent resin layer and the porous inorganic material. In contrast, according to this embodiment, the amount of light that is emitted from the light emitting element and reflected by the filler member toward outside of the light emitting device is not decreased, and the optical output and luminous efficiency of the light emitting device are improved.

Furthermore, in a base structure for mounting a light emitting element, according to an embodiment of the present invention, more preferably, a void space is provided between the transparent member and the porous inorganic material. Thereby, light emitted downward from the light emitting element is transmitted through the transparent member and a part of light is totally reflected upward from the interface with the void space according to Snell's law. Furthermore, light that has entered the void space is reflected upward according to the reflectance of the surface of the inorganic material and emitted out of the light emitting device. Because such a void space is provided between the transparent member and the porous inorganic material, the reflectance of the light emitted downward from the light emitting element is improved, and the optical output and luminous efficiency of the light emitting device are improved.

Furthermore, in a base structure for mounting a light emitting element, according to an embodiment of the present invention, in the configuration described above, preferably, the inorganic material includes at least one of titanium oxide, zirconium oxide, aluminum oxide, zinc oxide, calcium oxide, magnesium oxide, and barium sulfate. Since such a material has low light absorption with respect to the light to be reflected and has a large refractive index, a large angle of total reflection can be secured. Consequently, a filler member with high reflectance can be produced.

Furthermore, in a base structure for mounting a light emitting element, according to an embodiment of the present invention, in the configuration described above, preferably, the inorganic material contains, as a main component, a mixture of aluminum oxide, silicon dioxide, calcium oxide, and magnesium oxide. Consequently, a calcined body can be easily formed by calcining the porous inorganic material.

Furthermore, in a base structure for mounting a light emitting element, according to an embodiment of the present invention, in the configuration described above, preferably, the connection member is provided with a protruding portion on the entire outer side of the upper surface thereof. Thereby, radiant light from the light emitting device can be easily aligned in a certain direction and emitted. Moreover, when a light transmitting resin layer, etc. are provided on the upper surface of the base structure, the resin layer, etc. can be held by the protruding portion. Thus, the light emitting device can be fabricated more easily.

Furthermore, in a base structure for mounting a light emitting element, according to an embodiment of the present invention, in the configuration described above, preferably, the protruding portion has an inner surface which is a slanting surface slanting outward from the bottom end toward the top end. By allowing the slanting surface to function as a light reflection plane, the light collecting ability can be increased and the luminance of the light emitting device can be improved.

Furthermore, in a base structure for mounting a light emitting element, according to an embodiment of the present invention, in the configuration described above, preferably, the connection member has a lower outer circumferential portion having a screw shape. Thereby, the base structure according to this embodiment can be screwed into a socket device. Consequently, it is possible to prevent detachment due to a thermal or mechanical impact, such as the one caused by soldering, and accompanying connection defects.

Furthermore, a light emitting device according to an embodiment of the present invention includes a base structure for mounting a light emitting element, according to any one of the embodiments of the present invention described above, a light emitting element mounted on the light emitting element mounting portion and electrically connected to the supporting metallic member and the connection member, and a transparent material layer disposed to cover the light emitting element. Thereby, an increase in the temperature of the light emitting element can be suppressed, and a light emitting device with high luminance can be obtained.

Furthermore, by using a light emitting device according to an embodiment as a light source, by disposing a supporting metallic member and a light emitting element mounted on the supporting metallic member at predetermined positions, and by disposing a reflector, an optical lens, a light diffusion plate, and the like that are optically designed so as to have a predetermined shape in the periphery of the light emitting device, it is possible to produce a light emitting device that emits light with desired light distribution.

Furthermore, in a light emitting device according to an embodiment of the present invention, in the configuration described above, preferably, a light transmitting resin layer, which contains a phosphor, is disposed so as to cover the transparent resin layer. Light emitted by the light emitting element is converted into light with a desired wavelength by the phosphor of the light transmitting resin layer and the converted light is emitted from the light emitting device. Alternatively, the converted light is mixed with light emitted by the light emitting element and the mixed light is emitted from the light emitting device. Thus, a light emitting device capable of emitting light of a desired color can be produced.

Furthermore, in a light emitting device according to an embodiment of the present invention, in the configuration described above, preferably, the light transmitting resin layer has a curved surface protruding upward. Thus, light radially emitted from the light emitting device can be distributed satisfactorily.

Furthermore, in a light emitting device according to an embodiment of the present invention, in the configuration described above, preferably, the central portion is thicker than the peripheral portion in the light transmitting resin layer. Consequently, in the central portion of the light transmitting resin layer, which is near the light emitting element and strongly irradiated with light emitted from the light emitting element, light can be converted into fluorescent light by a large amount of phosphor contained in the thicker light transmitting resin layer, resulting in a more homogeneous luminescent color of the light emitting device.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A base structure for a light emitting device, comprising:
    a supporting device comprising a metallic material and configured to support a light emitting element;
    a connection device surrounding the supporting device, the connection device comprising a metallic material and configured to be electrically connected to the light emitting element; and
    a filler member filling a gap separating the supporting device from the connection device,
    wherein the filler member includes a material capable of reflecting light emitted from the light emitting element.

2. The base structure of claim 1, wherein the filler member comprises an insulating material and electrically insulates the supporting device from the connection device.

3. The base structure of claim 1, wherein the connection device has a cylindrical shape having a through hole in which the supporting device is accommodated.

4. The base structure of claim 1, wherein the connection device has a polygonal prism shape having a through hole in which the supporting device is accommodated.

5. The base structure of claim 1, wherein the connection device has a lower end portion having a screw shape for screwing into a socket device.

6. The base structure of claim 1, wherein the supporting device has at least one protruding portion projecting into the filler member.

7. The base structure of claim 1, wherein the connection device has at least one protruding portion projecting into the filler member.

8. The base structure of claim 1, wherein the connection device has a protruding portion positioned to reflect light emitted from the light emitting element.

9. The base structure of claim 8, wherein the protruding portion has a slanting surface configured to reflect the light emitted from the light emitting element.

10. The base structure of claim 1, further comprising a sealing member configured to seal the filler member from a resin deposited to cover the light emitting element.

11. The base structure of claim 10, wherein the sealing member is provided apart from the filler member.

12. The base structure of claim 10, wherein the sealing member comprises a transparent material.

13. A light emitting device comprising the base structure of claim 1, wherein the light emitting element is covered with a cover member comprising a resin material capable of transmitting the light emitted from the light emitting element.

14. The light emitting device of claim 13, further comprising a conversion element including at least one phosphor material and a binder material, wherein the at least one phosphor material is capable of absorbing the light emitted from the light emitting element and emitting a light having a wavelength different from a wavelength of the light emitted from the light emitting element, and the binder material is capable of transmitting the light emitted from the light emitting element and the light emitted from the at least one phosphor material.

15. The light emitting device of claim 14, the conversion element has a surface having a convex shape.

16. The light emitting device of claim 14, the conversion element has a central portion which is thicker than a circumferential portion.

17. A base structure for a light emitting device, comprising:
    supporting means for supporting a light emitting element, the supporting means comprising a metallic material;
    connection means for being electrically connected to the light emitting element; and
    a filler member filling a gap separating the supporting means from the connection means,
    wherein the filler member includes a material capable of reflecting light emitted from the light emitting element, and the supporting means is surrounded by the connection means.

18. A light emitting device comprising the base structure of claim 17, wherein the light emitting element is covered with a cover member comprising a resin material capable of transmitting the light emitted from the light emitting element.

19. A base structure for a light emitting device, comprising:
    a supporting device comprising a metallic material and having a supporting surface configured to support a light emitting element; and
    an insulating member electrically insulating the supporting device and comprising a transparent resin and a particulate material which has a refractive index higher than the transparent resin, the insulating member having a reflective surface provided around the supporting surface and configured to reflect light emitted from the light emitting element.

20. A light emitting device comprising the base structure of claim 19, wherein the light emitting element is covered with a cover member comprising a resin material capable of transmitting the light emitted from the light emitting element.

21. A base structure for a light emitting device, comprising:
    a supporting device comprising a metallic material and configured to support a light emitting element;
    a connection device surrounding the supporting device, the connection device comprising a metallic material and configured to be electrically connected to the light emitting element; and
    a filler member filling a gap separating the supporting device from the connection device,
    wherein the filler member comprises a transparent resin and a particulate material which has a refractive index higher than the transparent resin.

22. The base structure of claim 21, wherein the filler member has a surface having an irregularity produced by the particulate material contained in the filler member.

23. The base structure of claim 21, wherein the transparent resin comprises at least one material selected from the group consisting of an epoxy resin, a polycarbonate resin and a silicone resin.

24. The base structure of claim 21, wherein the particulate material comprises at least one material selected from the group consisting of $TiO_2$, $ZnO$, $ZrO_2$, diamond, $Al_2O_3$, $BaSO_4$, $CaO$ and $MgO$.

25. A light emitting device comprising the base structure of claim 21, wherein the light emitting element is covered with a cover member comprising a resin material capable of transmitting the light emitted from the light emitting element.

26. A base structure for a light emitting device, comprising:
    a supporting device comprising a metallic material and configured to support a light emitting element;

a connection device surrounding the supporting device, the connection device comprising a metallic material and configured to be electrically connected to the light emitting element; and a filler member filling a gap separating the supporting device from the connection device, wherein the filler member comprises a porous material capable of reflecting light emitted from the light emitting element.

27. The base structure of claim 26, wherein the filler member includes a transparent material having a refractive index smaller than the porous material.

28. The base structure of claim 26, wherein the porous material comprises at least one material selected from the group consisting of $TiO_2$, $ZrO_2$, $Al_2O_3$, ZnO, CaO, MgO and $BaSO_4$.

29. The base structure of claim 26, wherein the porous material includes at least one material selected from the group consisting of $Al_2O_3$, $SiO_2$, CaO and MgO.

30. The base structure of claim 26, wherein the porous material has a porosity from 15% to 43%.

31. A light emitting device comprising the base structure of claim 26, wherein the light emitting element is covered with a cover member comprising a resin material capable of transmitting the light emitted from the light emitting element.

* * * * *